United States Patent [19]
Hirano et al.

[11] Patent Number: 6,066,399
[45] Date of Patent: May 23, 2000

[54] HARD CARBON THIN FILM AND METHOD OF FORMING THE SAME

[75] Inventors: Hitoshi Hirano, Nishinomiya; Yoichi Domoto, Ikoma; Keiichi Kuramoto, Kadoma, all of Japan

[73] Assignee: Sanyo Electric Co., Ltd., Moriguchi, Japan

[21] Appl. No.: 09/045,163

[22] Filed: Mar. 19, 1998

[30] Foreign Application Priority Data

| Mar. 19, 1997 | [JP] | Japan | 9-066125 |
| Mar. 19, 1997 | [JP] | Japan | 9-066126 |
| Sep. 25, 1997 | [JP] | Japan | 9-259833 |

[51] Int. Cl.⁷ .............................. B32B 9/06; C23C 16/00
[52] U.S. Cl. ...................... 428/408; 428/212; 428/697; 428/698; 428/699; 428/701; 428/702; 427/249
[58] Field of Search .................... 428/212, 408, 428/697, 699, 701, 702; 427/249

[56] References Cited

U.S. PATENT DOCUMENTS

| 4,647,494 | 3/1987 | Meyerson et al. | 428/408 |
| 4,777,090 | 10/1988 | Ovshinsky et al. | 428/408 |
| 4,877,677 | 10/1989 | Hirochi et al. | 428/408 |
| 5,173,089 | 12/1992 | Tanabe et al. | 51/293 |
| 5,237,967 | 8/1993 | Willermet et al. | |
| 5,368,937 | 11/1994 | Itoh | 428/408 |

FOREIGN PATENT DOCUMENTS 1317197 12/1989 Japan.

Primary Examiner—Archene Turner
Attorney, Agent, or Firm—W. F. Fasse; W. G. Fasse

[57] ABSTRACT

A hard carbon thin film formed on a substrate has a graded structure in which a ratio of $sp^2$ to $sp^3$ carbon-carbon bonding in the thin film decreases in its thickness direction from a thin film/substrate interface toward a surface of the thin film.

13 Claims, 15 Drawing Sheets

Distance From
The Film/Substrate Interface

HARD CARBON THIN FILM AND METHOD OF FORMING THE SAME

BACKGROUND OF THE INVENTION

Field of the Invention

The present invention relates to a hard carbon thin film and a method of forming the hard carbon thin film.

Description of Related Art

Hard carbon thin films exhibit excellent hardness, resistivity, chemical stability and the others, and have gathered expectations for their applications to functional thin films for electronic devices and semiconductors, e.g. protective coatings on sliding parts for compressors such as rotary compressors, protective coatings on blades such as electric shaver blades, protective coatings on masks for screen deposition as well as on squeegees, constituent film layers of solar cells, protective coatings on thin film magnetic heads, and protective coatings on SAW devices.

In the above applications, poor adhesion of the hard carbon thin film to an underlying layer becomes problematic occasionally. A technique to improve its adhesion to the underlying layer such as a substrate has been proposed which provides a silicon interlayer between the underlying layer and the hard carbon thin film (See, for example, Japanese Patent Laying-Open No. Hei 1-317197 (1989)).

Although the conventional techniques such as mentioned above have a potential advantage of imparting increased adhesion, delamination of the hard carbon thin film from the underlying layer is disadvantageously occasioned when influenced by the internal stress of the hard carbon thin film which becomes greater as a thickness thereof increases. Also, the interlayer must be formed in a separate step which results in a complicated fabrication.

In view of the above, there has been a continuing need for a hard carbon thin film which is capable of exhibiting an improved adherence to an underlying layer such as a substrate.

A crystalline hard carbon thin film, as generally called a diamond thin film, is typically formed through thermal decomposition of a material gas such as methane using a hot filament. Such a technique is however accompanied by the elevation of a substrate temperature up to about 1000° C. which limits the material type of a substrate to be used. Also, the diamond thin film thus formed generally exhibits a large surface irregularity, which necessitates post-polishing thereof to smooth the surface, such as for use as a surface acoustic wave device.

A diamond-like thin film mainly consisting of non-crystalline or amorphous components has also been known as illustrative of the hard carbon thin film. Such a diamond-like thin film is generally formed using a plasma CVD technique which permits the formation thereof at a reduced substrate temperature around a room temperature. The diamond-like thin film thus formed is superior in surface smoothness but is generally inferior in surface hardness to the diamond thin film.

Accordingly, there remain a need for a technique which is capable of forming diamond thin films having smaller surface irregularities at reduced substrate temperatures, and another need for a technique which is capable of forming diamond-like thin films having increased surface hardnesses. Such needs would be met if a technique is provided which can control to some extent those mechanical properties of the diamond and diamond-like thin films to form hard carbon thin films with tailored properties. However, such a technique has not been reported up to date.

SUMMARY OF THE INVENTION

It is an object of the present invention to provide a hard carbon thin film which exhibits a satisfactory hardness as well as a good adhesion to an underlying layer such as a substrate, and a method of forming the hard carbon thin film.

It is another object of the present invention to provide a method for forming a hard carbon thin film which can control a proportion of crystalline and non-crystalline components in the thin film as well as its film properties such as hardness and surface smoothness.

A hard carbon thin film in accordance with a first aspect of the present invention characteristically has a graded structure in which a ratio of $sp^2$ to $sp^3$ carbon-carbon bonding (hereinafter referred to as "$sp^2/sp^3$ ratio") in the thin film decreases in its thickness direction from a film/underlayer interface toward a surface of the thin film.

A hard carbon thin film in accordance with a second aspect of the present invention comprises two or more layers having respective individual $sp^2/sp^3$ ratios different from each other, so that the $sp^2/sp^3$ ratio in the thin film decreases in a stepwise manner in its thickness direction from a film/underlayer interface toward a surface of the thin film.

A hard carbon thin film in accordance with a second aspect of the present invention characteristically has a graded structure in which the $sp^2/sp^3$ ratio in the thin film in its thickness direction decreases from a film/underlayer interface to a minimum and increases therefrom toward a surface of the thin film.

A hard carbon thin film in accordance with a fourth aspect of the present invention characteristically comprises three or more layers having respective individual $sp^2/sp^3$ ratios different from each other, so that the $sp^2/sp^3$ ratio in the thin film decreases in a stepwise manner in its thickness direction from a film/underlayer interface to a minimum and increases therefrom in a stepwise manner toward a surface of the thin film.

The $sp^2$ and $sp^3$ carbon-carbon bondings indicate different forms of chemical bonding between carbon atoms. It is generally known that the carbon-carbon bonding in the diamond thin film is predominantly $sp^3$ while that in a graphite is predominantly $sp^2$. It is also known that an amorphous diamond-like carbon thin film, as well as a partially crystalline diamond-like carbon thin film, may have a structure in which both $sp^2$ and $sp^3$ carbon-carbon bondings are distributed therethrough. In the present invention, such a $sp^2/sp^3$ ratio is characteristically varied in a film thickness direction as described earlier.

In the present invention, the $sp^2/sp^3$ ratio is varied preferably in the range of 0–3. Accordingly, the present invention is intended to include the case where the $sp^2/sp^3$ ratio is zero, i.e., the carbon-carbon bonding in the thin film is essentially devoid of $sp^2$ and predominantly of $sp^3$.

In general, the increased $sp^2/sp^3$ ratio, accordingly the increased proportion of $sp^2$ carbon-carbon bonding tends to cause a decrease in internal stress to provide better adhesion to an underlying layer such as a substrate. On the other hand, the reduced $sp^2/sp^3$ ratio, accordingly the increased proportion of $sp^3$ carbon-carbon bonding tends to produce a film with increased hardness and internal stress.

The $sp^2/sp^3$ ratio as specified in the present invention can be determined such as by an electron energy loss spectroscopy (EELS).

In the present invention, the hard carbon thin film is contemplated to include a crystalline diamond carbon thin film, an amorphous diamond-like carbon thin film, and a diamond-like carbon thin film having a partial crystalline structure. Accordingly, the change of $sp^2/sp^3$ ratio in a thickness direction of a thin film may be accompanied by the change in proportion of crystalline and non-crystalline components in the thickness direction of the film.

The hard carbon thin film according to the present invention can be formed using generally-employed film-forming techniques. Foremost among those techniques are plasma CVD techniques including an ECR plasma CVD technique. A hot-filament CVD technique may also be used. Such techniques as to physically form thin films may also be applicable which include a sputtering technique and an ion beam deposition technique using an ion gun. Furthermore, the thin film may be formed using any combination of the above-mentioned plasma CVD, hot-filament CVD, sputtering and ion-beam deposition techniques.

The hard carbon thin film of the present invention may be formed on an underlying layer such as a substrate through an interlayer interposed therebetween. The material types of the interlayer include Si, Ti, Zr, W, Mo, Ru, Ge and oxides, nitrides and carbides thereof. The interlayers comprised of such materials can be formed such as by a magnetron RF sputtering technique. For example, any of those metallic elements can be sputtered in an argon plasma to form the interlayer. An oxygen or nitrogen gas may be introduced into a chamber during the sputtering to form the interlayer comprised of oxides or nitrides of any of those elements. The interlayer is formed to a typical thickness in the range of 20Å–300Å.

A first method for forming the hard carbon thin film of the present invention using a plasma CVD technique is characterized in that ion species, associated with formation of the thin film, in a plasma are varied in kinetic energy with film-forming time, so that the $sp^2/sp^3$ ratio in the hard carbon thin film is varied in its thickness direction. In order to vary the kinetic energies of those ion species, an acceleration voltage may be applied to them by applying a voltage to a grid disposed between a plasma generation chamber and a substrate, for example.

A second method for forming the hard carbon thin film of the present invention using a plasma CVD technique is characterized in that a varied amount of a hydrogen gas is admitted to a reaction system for its change with film-forming time, so that the $sp^2/sp^3$ ratio in the thin film is varied in its thickness.

A third method for forming the hard carbon thin film of the present invention using a plasma CVD technique is characterized in that a substrate temperature is varied with film-forming time, so that the $sp^2/sp^3$ ratio in the thin film formed on the substrate is varied in its thickness direction.

A fourth method for forming the hard carbon thin film of the present invention using a plasma CVD technique is characterized in that the proportion of ion species associated with formation of the thin film is varied with film-forming time, so that the $sp^2/sp^3$ ratio in the thin film is varied in its thickness direction. Those ion species associated with formation of the thin film include $CH_3^+$ and $CH_2^+$, for example. The $sp^2/sp^3$ ratio in the thin film can be varied in its thickness direction by varying the proportion of those ion species with film-forming time.

The above-described first through fourth methods may be performed independently or in any combination thereof.

Furthermore, the hard carbon thin film of the present invention can be formed using a technique in accordance with a fifth aspect of the present invention which will be described hereinafter.

The film-forming method of the present invention characteristically utilizes a plasma CVD process in varying the ion species associated with formation of the thin film to thereby varying the composition or structure of the thin film in its thickness direction. The composition or structural gradient in a thickness direction of the thin film can be produced such as by varying the $sp^2/sp^3$ ratio in a thickness direction of the thin film, e.g., by varying the ion species, such as $CH_3^+$ and $CH_2^+$ as described above as being associated with formation of the thin film, with film-forming time.

In accordance with a fifth aspect of the present invention, a method is provided for forming a hard carbon thin film through decomposition of a material gas. A characteristic feature of the method is that the material gas is decomposed using a technique of exposing them to heat or/and to a plasma whereby the film properties of the resulting hard carbon thin film can be controlled.

The method in accordance with the fifth aspect of the present invention combines a thermal decomposition technique, which is suited for formation of hard carbon thin films having higher degrees of crystallinity such as diamond thin films, and a plasma-assisted decomposition technique which is suited for formation of hard carbon thin films having a major proportion of amorphous components such as diamond-like thin films, to thereby control a proportion of crystalline and non-crystalline components in the hard carbon thin film and accomplish the control of its film properties such as hardness and surface smoothness.

Illustrative of the thermal decomposition technique is a technique which thermally decomposes the material gas by exposing them to heat from a hot filament disposed above a substrate on which the hard carbon thin film is to be deposited.

Exemplary techniques of forming the hard carbon thin films through plasma-assisted decomposition of the material gas include generally-employed plasma CVD, radio-frequency (RF) plasma CVD, DC plasma CVD, and electron cyclotron resonance (ECR) plasma CVD techniques. The ECR plasma CVD technique is preferred when desired to form wide-area hard carbon thin films.

In one embodiment practicing the method in accordance with the fifth aspect of the present invention, the film formation through the thermal decomposition of the material gas is followed by the additional film formation through the plasma-assisted decomposition of the material gas. As discussed earlier, the use of thermal decomposition technique is effective in forming the hard carbon thin film having a higher degree of crystallinity. The succeeding film formation thereon using the plasma-assisted decomposition technique is affected by the higher degree of crystallinity of the underlying hard carbon thin film to result in formation of the additional hard carbon thin film having an increased degree of crystallinity or hardness as a whole.

In another embodiment practicing the method in accordance with the fifth aspect of the present invention, the film formation through the thermal decomposition of the material gas is effected while the film formation through the plasma-assisted decomposition of the material gas is in progress. Such a simultaneous occurrence of the thermal and plasma-assisted decomposition of the material gas results in formation of the hard carbon thin film having a higher degree of crystallinity or hardness than when formed solely through the plasma-assisted decomposition of the material gas.

In the fifth aspect of the present invention, whether the hard carbon thin film formed has a crystalline diamond nature or an amorphous diamond-like nature depends upon the film-forming conditions respectively through the thermal decomposition and plasma-assisted decomposition of the raw material gas. Accordingly, the suitable control of these film-forming conditions results in formation of the hard carbon thin film having tailored film properties.

Also, whether the hard carbon thin film formed has a crystalline diamond nature or an amorphous diamond-like nature can be determined such as by a Raman spectroscopy, as will be described hereinafter.

In a further narrowed aspect of the present invention, a method for forming a hard carbon thin film comprises a first step and a subsequent second step. In the first step, a hard carbon thin film is formed using a first technique incorporating at least a film-forming technique through thermal decomposition of a material gas. The first step is followed by the second step in which an additional hard carbon thin film is formed thereon using a second technique incorporating at least a film-forming technique through decomposition of the material gas by a plasma.

In the first step, a hard carbon thin film is formed by using the first technique incorporating at least the film-forming technique through thermal decomposition of a material gas. Accordingly, the hard carbon thin film may be formed by solely using the film-forming technique through thermal decomposition of the material gas. If desired, the first technique may further incorporate another film-forming technique, such as the film-forming technique through plasma-assisted decomposition of the material gas, for simultaneous practice with the film-forming technique through thermal decomposition of the material gas.

In the second step, the additional hard carbon thin film is formed thereon using the second technique incorporating at least the film-forming technique through plasma-assisted decomposition of the material gas. Accordingly, a hard carbon thin film may be formed by solely using the film-forming technique through plasma-assisted decomposition of the material gas. If desired, the second technique may further incorporate another film-forming technique, such as the film-forming technique through thermal decomposition of the material gas, for simultaneous practice with the film-forming technique through plasma-assisted decomposition of the material gas.

Since in the first step, the hard carbon thin film is formed by using the first technique incorporating at least the film-forming technique through thermal decomposition of the material gas, a relatively high degree of crystallinity can be imparted to the resulting hard carbon thin film. In the second step, the second technique is used to form the additional hard carbon thin film on the hard carbon thin film having the higher degree of crystallinity resulting from the first step, so that the relatively high degree of crystallinity of the underlying hard carbon thin film favorably affects the succeeding formation of the additional hard carbon thin film in the second step. Therefore, the hard carbon thin film can be formed which has a relatively high degree of crystallinity or hardness as a whole. Also, since the second technique incorporates at least the film-forming technique through plasma-assisted decomposition of the material gas, amorphous components may be produced in the overlying hard carbon thin film formed by using the second technique, thereby imparting a relatively good surface smoothness, approaching at best to that of the diamond-like thin film, to the resulting hard carbon thin film.

In accordance with the present aspect, the second technique incorporating at least the film-forming technique through plasma-assisted decomposition of the material gas at a relatively low temperature, when practiced subsequent to the first technique incorporating at least the film-forming technique through thermal decomposition of the material gas, imparts a smooth surface as well as an increased degree of crystallinity or hardness as a whole to the overlying hard carbon thin film.

In the fifth aspect of the present invention, in addition to admitting the material gas, a method further admits a hydrogen gas to a reaction system to thereby control film properties of the resulting hard carbon thin films. Introduction of the hydrogen gas contributes to removal of graphite components to permit selective formation of diamond thin films which have higher degrees of crystallinity and hardness.

Also in the fifth aspect of the present invention, a hard carbon thin film is formed on a substrate through an interlayer provided therebetween. The formation of the hard carbon thin film through the interlayer improves its characteristics, e.g. adhesion or adherence to the substrate. The interlayer may be comprised of a thin film of Si, Ti, Zr, Ge, or oxides or nitrides thereof. The film thickness of the interlayer is not particularly specified, but is preferably in the range of 20Å–1000Å.

In a sixth aspect of the present invention, a method is provided which forms an amorphous carbon coating on a substrate. Characteristically, a substrate is at its surface cleaned prior to formation of the hard carbon thin film thereon, and/or the hard carbon thin film is at its growth surface cleaned during formation thereof. The precleaning of the substrate serves to remove dusts, surface irregularities and scratches, which if present, provide undesirable growth surfaces on the substrate, to assure an uniform growth of the amorphous carbon coating on the substrate. Also, the cleaning or etching during coating formation serves to eliminate irregularity or unevenness of the coating growth surface to further insure the uniform growth of the amorphous carbon coating.

Ion or energy beam irradiation may be effected to clean the substrate surface prior to coating formation and/or the coating growth surface during the coating formation. In the ion beam irradiation, inert gas ions such as an Ar gas ion may be emitted such as by an ion gun. The condition of ion beam emission is not particularly specified, but generally at an ion current density of 0.01–5 mA/cm$^2$, an acceleration voltage of 20–10,000 eV, and an inert gas partial pressure of $1\times10^{-6}$–$1\times10^{-1}$ Torr.

An electron or laser beam may be employed to effect the energy beam irradiation. The electron beam may be emitted under a typical current density condition of $1\times10^{-2}$–$1\times10^{1}$ A/cm$^2$. The laser beam may be emitted under a typical power density condition of $1\times10^{-3}$–$1\times10^{8}$ W/cm$^2$. Laser beam sources include excimer, argon, YAG, CO$^2$, He—Cd, semiconductor, ruby lasers. Such an energy beam is generally scanned over the substrate surface or the coating growth surface. The energy beam may be provided in a pulsed form, if necessary.

Also in the sixth aspect of the present invention, in order for the substrate surface to be cleaned, the substrate may be irradiated with a plasma prior to coating formation thereon. The plasma may be an inert gas plasma, for example. A voltage may be applied to the substrate for acceleration of the produced plasma onto the substrate. For example, a radio-frequency voltage may be applied to the substrate so that a negative voltage is generated in the substrate which preferably has an absolute value of 20 V or higher.

In the case where the cleaning or etching is effected during coating formation, such a treatment preferably completes after the lapse of about one tenth of a total film-forming process from the start of coating formation.

For the method for forming an amorphous carbon film in accordance with the sixth aspect of the present invention, applicable film-forming techniques include general vapor phase epitaxial techniques, e.g., CVD techniques as represented by plasma CVD techniques such as the ECR plasma CVD technique and hot-filament CVD technique, sputtering and vacuum deposition techniques.

In accordance with the sixth aspect of the present invention, the surface cleaning treatment either prior to or during coating formation results in formation of an amorphous carbon coating which exhibits a surface roughness $h_{rms}$ not exceeding one fifth of a thickness thereof. Under a selected cleaning condition, an amorphous carbon coating may be formed which exhibit a surface roughness $h_{rms}$ not exceeding one tenth of a thickness thereof. The values of surface roughness has can be determined by using a stylus-based technique, and indicated by root-mean-square deviations from a mean surface.

An amorphous carbon coating in accordance with the sixth aspect of the present invention characteristically exhibits, immediately after formation thereof, a surface roughness $h_{rms}$ not exceeding one fifth, preferably one tenth of a thickness thereof. The amorphous carbon coating in accordance with the sixth aspect of the present invention exhibits such a surface roughness immediately after formation thereof, i.e., before any post-processing, such as polishing, is applied to a coating surface immediately after formation thereof.

DESCRIPTION OF THE PREFERRED EMBODIMENTS

Figure 1:
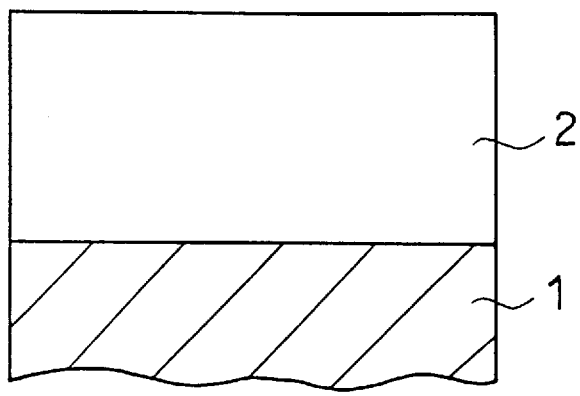
FIG. 1 is a schematic cross-sectional view of one embodiment of a hard carbon thin film in accordance with a first aspect of the present invention.

FIG. 1 is a schematic cross-sectional view of one embodiment of a hard carbon thin film in accordance with a first aspect of the present invention. Formed on a substrate 1 is a hard carbon thin film 2.

Figure 2:
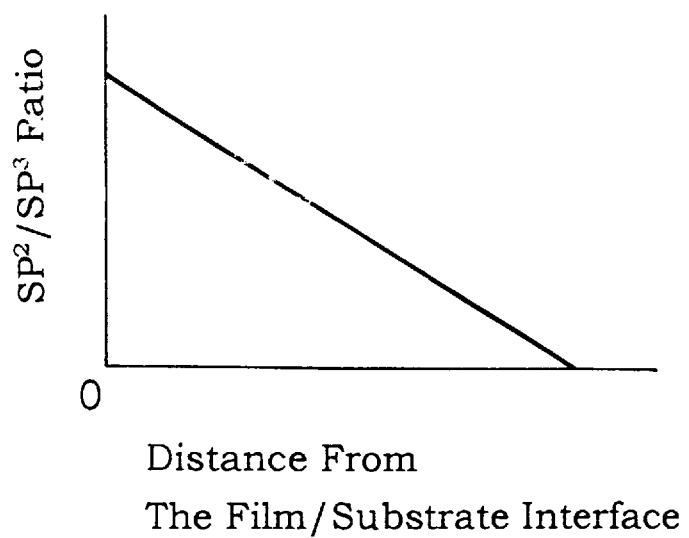
FIG. 2 is a graph showing a varied $sp^2/sp^3$ ratio in a thickness direction of the hard carbon thin film shown in FIG. 1.

FIG. 2 is a graph showing the changes of $sp^2/sp^3$ ratio in a thickness direction of the hard carbon thin film 2 of FIG. 1. As shown in FIG. 2, the $sp^2/sp^3$ ratio decreases in the thickness direction of the film, i.e., toward its surface from a film/substrate interface. It follows that the hard carbon thin film 2 has an increased $sp^2/sp^3$ ratio and accordingly a reduced internal stress in the vicinity of the film/substrate interface, and has good adhesion to the substrate 1. Also, the hard carbon thin film 2 has a decreased $sp^2/sp^3$ ratio and accordingly increased hardness and internal stress in the vicinity of its surface.

Figure 3:
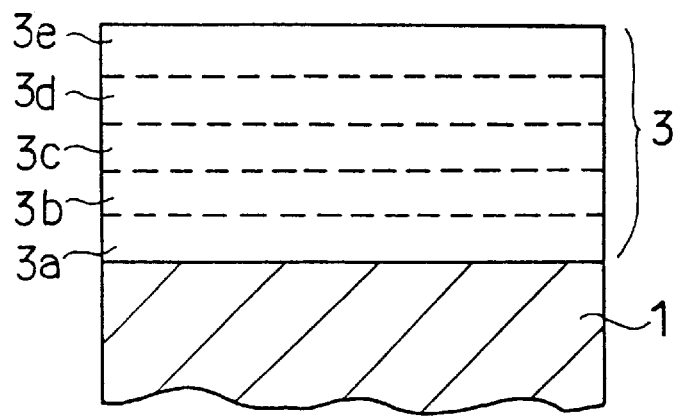
FIG. 3 is a schematic cross-sectional view of one embodiment of a hard carbon thin film in accordance with a second aspect of the present invention.

FIG. 3 is a schematic cross-sectional view of one embodiment of a hard carbon thin film in accordance with a second aspect of the present invention. Formed on the substrate 1 is a hard carbon thin film 3 comprised of plural layers 3a through 3e stacked on the substrate 1.

Figure 4:
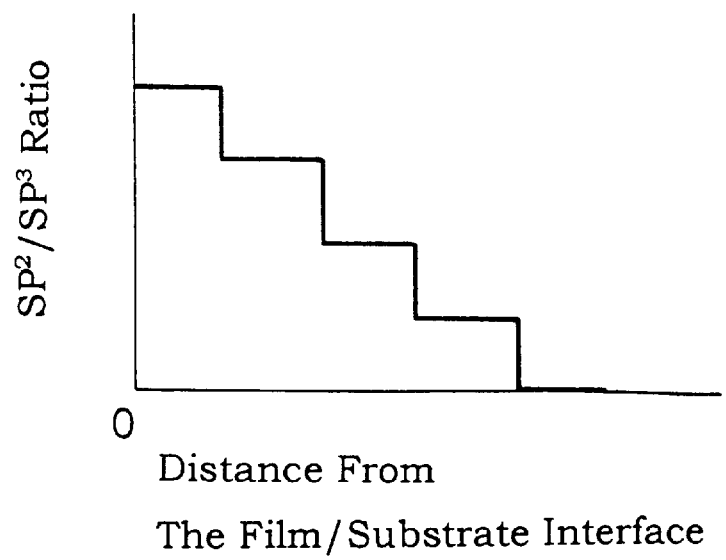
FIG. 4 is a graph showing a varied $sp^2/sp^3$ ratio in a thickness direction of the hard carbon thin film shown in FIG. 3.

FIG. 4 is a graph showing the changes of $sp^2/sp^3$ ratio in a thickness direction of the hard carbon thin film 3 of FIG. 3. As shown in FIG. 4, the $sp^2/sp^3$ ratio decreases in a stepwise manner from layer to layer in the thickness direction of the film, i.e., toward its surface from a film/substrate interface. As can be seen from FIG. 4, in this particular embodiment, each layer has a substantially uniform $sp^2/sp^3$ ratio through its thickness, and the layers are stacked on the substrate in a sequence of decreasing $sp^2/sp^3$ ratio to constitute the hard carbon thin film 3. The lower-most layer 3a adjacent to the substrate 1 comprises a composition having the greatest $sp^2/sp^3$ ratio and accordingly the least internal stress for better adherence to the substrate 1. The upper-most layer 3e adjacent to the surface of the hard carbon thin film 3 comprises a composition having the least $sp^2/sp^3$ ratio and accordingly the greatest internal stress and hardness.

Figure 5:
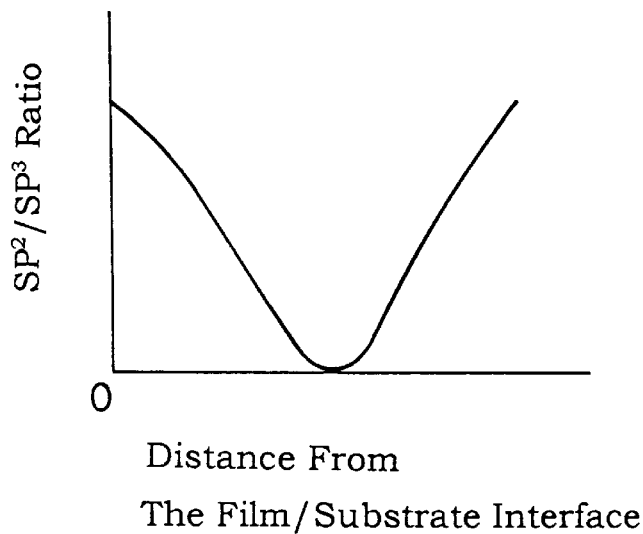
FIG. 5 is a graph showing a varied $sp^2/sp^3$ ratio in a thickness direction of one embodiment of a hard carbon thin film in accordance with a third aspect of the present invention.

FIG. 5 is a schematic cross-sectional view of one embodiment of a hard carbon thin film in accordance with a third aspect of the present invention. A hard carbon thin film in accordance with the present embodiment is formed on a substrate in the same manner as the embodiment shown in FIG. 1. The $sp^2/sp^3$ ratio gradually decreases from a substrate/film interface to a minimum at an intermediate of the thin film, and then increases therefrom toward a surface of the thin film. Accordingly, the hard carbon thin film comprises compositions having the greater $sp^2/sp^3$ ratios and the less internal stresses in the respective vicinities of the substrate/film interface and the film surface. The hard carbon thin film is at its intermediate less in the $sp^2/sp^3$ ratio, and accordingly higher in both film hardness and internal stress. As a result, the hard carbon thin film has a smooth surface due to the greater $sp^2/sp^3$ ratio.

Figure 6:
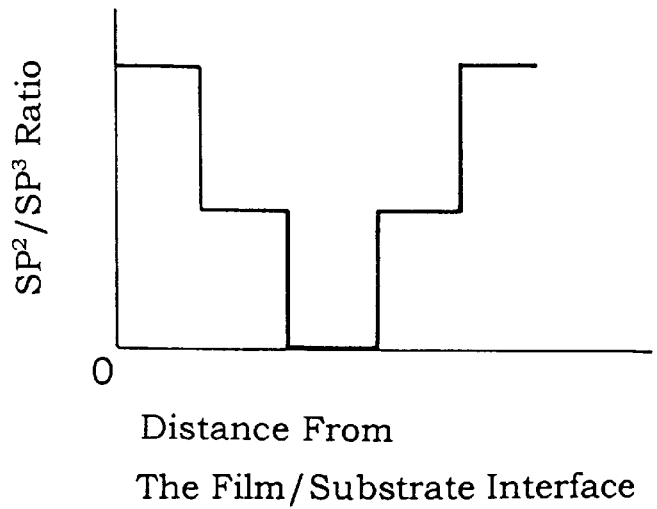
FIG. 6 is a graph showing a varied $sp^2/sp^3$ ratio in a thickness direction of one embodiment of a hard carbon thin film in accordance with a fourth aspect of the present invention.

FIG. 6 is a schematic cross-sectional view of one embodiment of a hard carbon thin film in accordance with a fourth aspect of the present invention. A hard carbon thin film of this embodiment is constructed by stacking plural layers 3a through 3e on the substrate 1 in the same manner as the embodiment shown in FIG. 3. As can be seen from FIG. 6, the $sp^2/sp^3$ ratio decreases in a stepwise manner from a lower-most layer adjacent to a substrate/film interface to a minimum at an intermediate layer, and then increases therefrom in a stepwise manner toward an upper-most layer adjacent to a surface of the thin film. Accordingly, the lower-most and upper-most layers have the greater $sp^2/sp^3$ ratios and the lower internal stresses, respectively. The intermediate layer has the least $sp^2/sp^3$ ratio, and accordingly the higher film hardness and internal stress. Also, the hard carbon thin film has an extremely smooth surface for its greater $sp^2/sp^3$ ratio. As a result, the hard carbon thin film in accordance with the fourth aspect has a smooth surface due to the greater $sp^2/sp^3$ ratio and is still high in its overall hardness.

Figure 7:
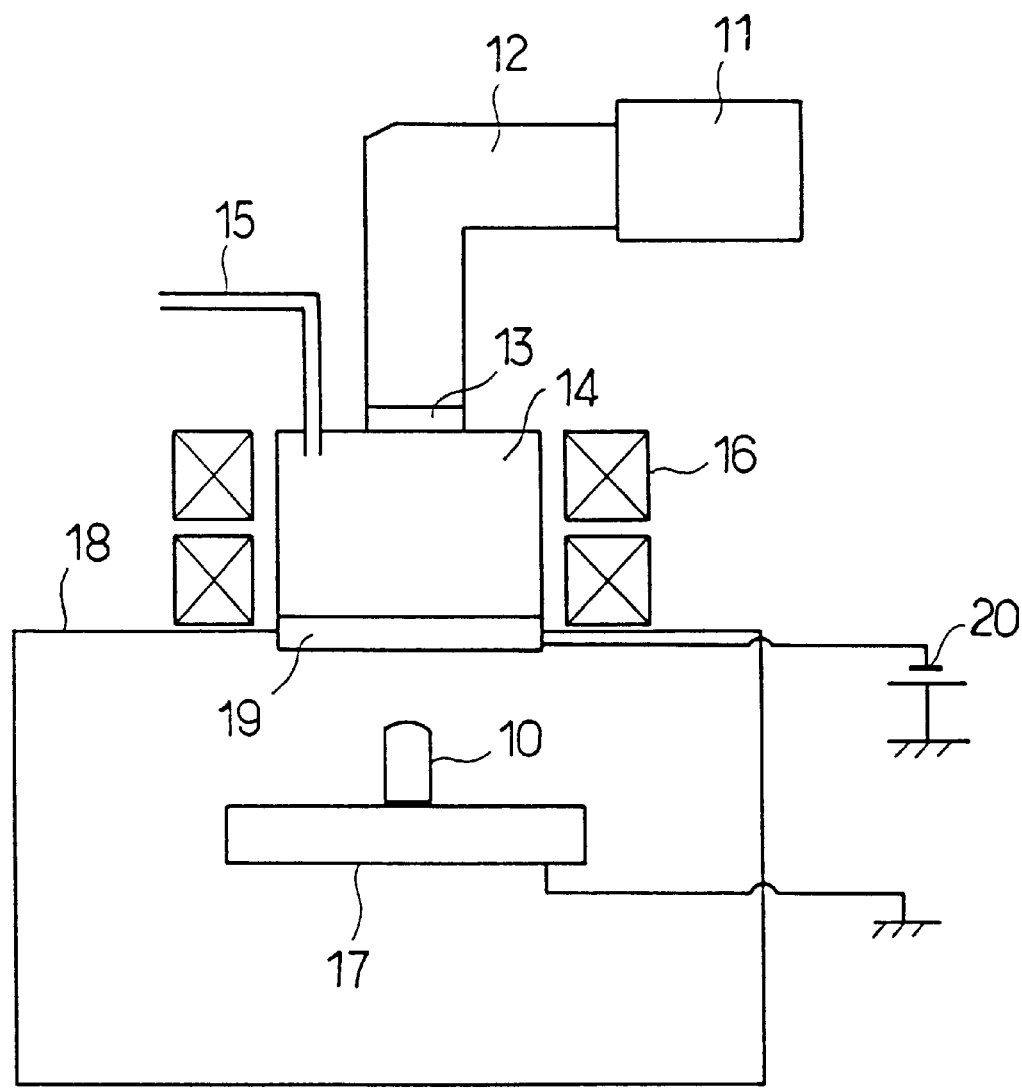
FIG. 7 is a schematic constituent diagram of an exemplary ECR plasma CVD apparatus for forming hard carbon thin films in accordance with the present invention.

FIG. 7 is a schematic cross-sectional view showing an exemplary ECR plasma CVD apparatus which is capable of forming the hard carbon thin film of the present invention. Referring to FIG. 7, a vacuum chamber 18 has a plasma generation chamber 14 to which one end of a waveguide 12 is connected. Another end of the waveguide 12 is mounted to a microwave supplying means 11. A microwave generated in the microwave supplying means 11 passes through the waveguide 12 and a microwave inlet window 13 to be guided into the plasma generation chamber 14.

The plasma generation chamber 14 is provided with a gas inlet line 15 for introducing a discharge gas such as argon (Ar), as well as a raw material gas such as methane ($CH_4$) or hydrogen ($H_2$), into the plasma generation chamber 14. Also, a plurality of plasma magnetic field generators 16 are mounted circumferentially of the plasma generation chamber 14. A high density ECR plasma can be generated within the plasma generation chamber 14 through the interaction of a high-frequency magnetic field produced by the microwave and a magnetic field generated by the plasma magnetic field generators 16.

The vacuum chamber 18 encloses a substrate holder 17 on which a substrate 10 is placed. In this embodiment, employed as the substrate 10 is a sliding part of a rotary compressor, i.e., a vane (made of high-speed tool steel).

Located in an area between the plasma generation chamber 14 and the substrate 10 is a grid 19 to which a cathode of a direct-current power source 20 is connected for applying a negative voltage to the grid 19. The application of negative voltage to the grid 19 imparts an accelerating energy to positive ions in the plasma within the plasma generation chamber 14 so that the positive ions are accelerated onto the substrate 10. Therefore, the ion kinetic energy in the plasma can be controlled by regulating the voltage to be applied to the grid. In specific, the ion kinetic energy can be increased by applying an increased acceleration voltage to the grid 19.

EXAMPLE 1

The apparatus shown in FIG. 7 is employed to form a hard carbon thin film having a graded structure in which the $sp^2/sp^3$ ratio decreases continuously in a uniform manner in a thickness direction of the film, i.e., toward its surface from a film/substrate interface.

The vacuum chamber 18 is first evacuated to a pressure of $10^{-5}$–$10^{-7}$ Torr. Then, Ar and $CH_4$ gases are introduced into the plasma generation chamber 14 at respective pressures of $2.5 \times 10^{-4}$ Torr. and $3.0 \times 10^{-4}$ Torr. to convert them into plasmas within the plasma generation chamber 14.

Figure 8:
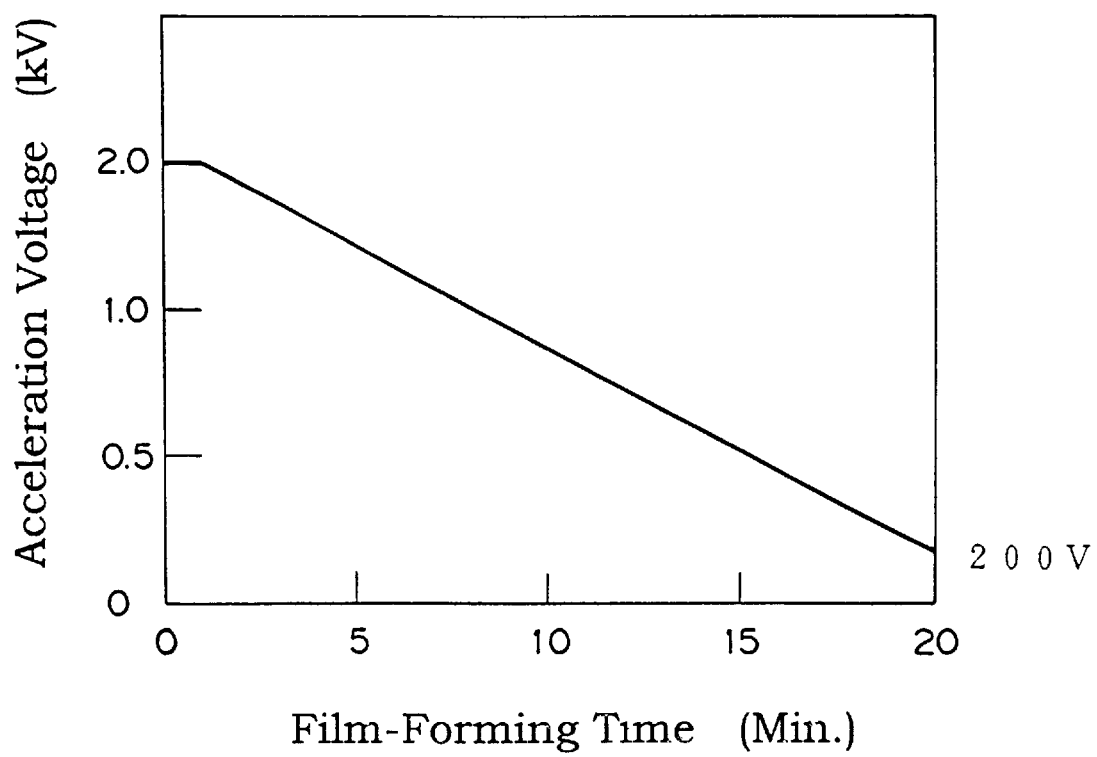
FIG. 8 is a graph showing a first exemplary pattern of an acceleration voltage varied with film-forming time for application to a grid in accordance with one embodiment of the present invention.
Figure 9:
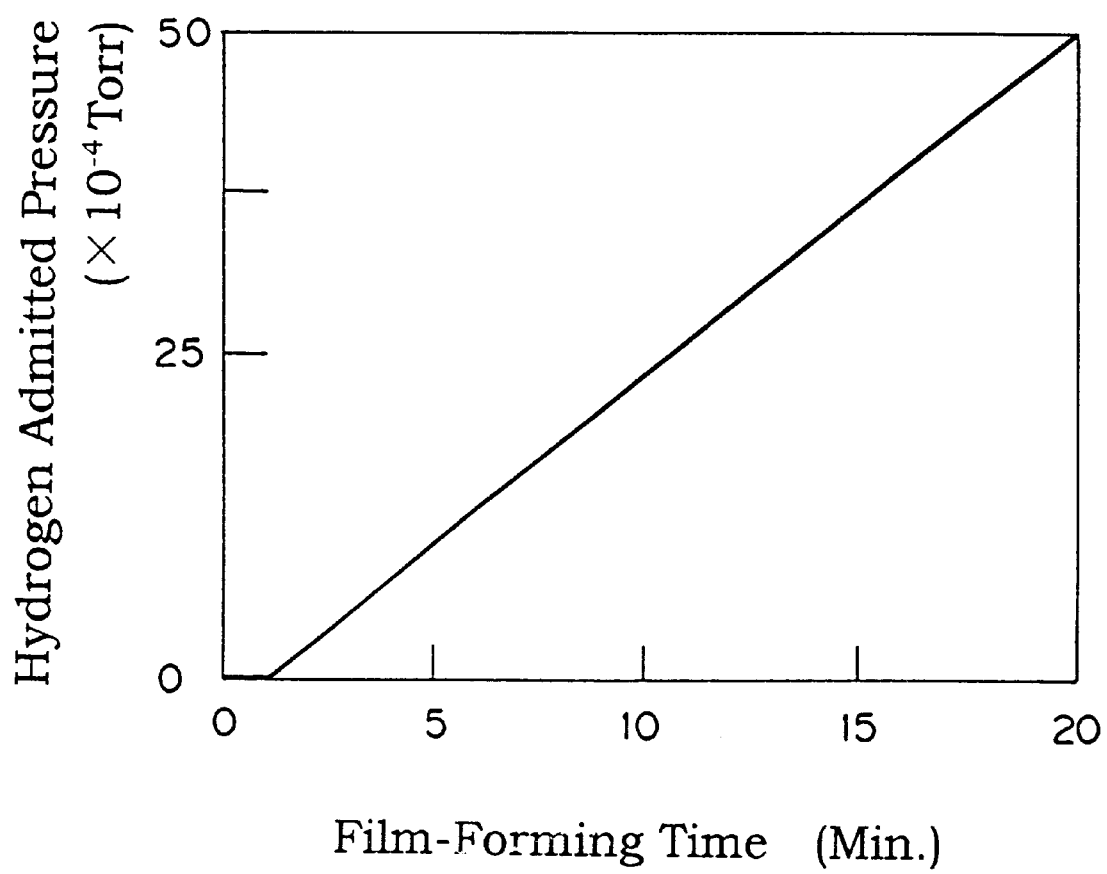
FIG. 9 is a graph showing a first exemplary pattern of a supply pressure, varied with film-forming time, to which a hydrogen gas is admitted in a reaction system in accordance with one embodiment of the present invention.

Next, the varying acceleration voltage is applied to the grid 19 in such a controlled fashion that it is maintained at 2 kV for the first one minute period at the initial stage of film formation and decreased with film-forming time to a final value of 200 V, as shown in FIG. 8. Concurrently, an $H_2$ gas is introduced through the gas inlet line 15 into the plasma generation chamber 14 in such a controlled fashion that its supply pressure starts to rise after the lapse of one minute at the initial stage of film formation and continuously increases with film-forming time to a final value of $5.0 \times 10^{-3}$ Torr., as shown in FIG. 9.

A hard carbon thin film is thus formed on the substrate 10. The obtained hard carbon thin film was measured for the $sp^2/sp^3$ ratios in its thickness direction by an electron energy loss spectroscopy (EELS). As a result, the $sp^2/sp^3$ ratio was found to be 3 for the substrate-neighboring film portion formed during the first one minute period at the initial stage of film formation while the $sp^2/sp^3$ ratio was found to be zero for the film surface portion in which the C—C bonding was essentially devoid of $sp^2$ and predominantly $sp^3$. Also, the substrate-neighboring film portion was found as comprising amorphous diamond-like carbon while the film surface portion as comprising crystalline diamond.

The surface portion of the hard carbon thin film obtained was measured for hardness to reveal a value of 7000 Hv (Vickers hardness). For comparative purposes, the acceleration voltage applied to the grid was maintained at 2 kV from the start till the completion of film formation to form a hard carbon thin film of Comparative Example 1-1 which was measured for hardness to reveal a value of 4000 Hv.

Also, in order to evaluate the adherence of the obtained hard carbon thin film to the substrate, a constant load (2 kg) indentation test was carried out using a Vickers penetrator. Fifty sample pieces were used for the test, and the number of sample pieces which showed delamination was counted as indicating the level of adherence of the hard carbon thin film. For comparative purposes, a hard carbon thin film of Comparative Example 1-2 was formed with no acceleration voltage applied to the grid during film formation, which was duly subjected to the indentation test using a Vickers penetrator as similar to the above. The number of sample pieces which showed delamination was found to be 0 for the hard carbon thin film of Example 1 according to the present invention, and 26 for the hard carbon thin film of Comparative Example 1-2.

As can be appreciated from the foregoing, in addition to being high in hardness, the hard carbon thin film in accordance with the present invention is excellent in adherence.

EXAMPLE 2

The apparatus shown in FIG. 7 is employed to form a hard carbon thin film having a graded structure in which the $sp^2/sp^3$ ratio decreases in a stepwise manner (one step in this Example) in a thickness direction of the film, i.e., toward its surface from a film/substrate interface.

The vacuum chamber 18 is first evacuated to a pressure of $10^{-5}$–$10^{-7}$ Torr. Then, Ar and $CH_4$ gases are introduced into the plasma generation chamber 14 at respective pressures of $2.5 \times 10^{-4}$ Torr. and $3.0 \times 10^{-4}$ Torr. to convert them into plasma within the plasma generation chamber 14.

Figure 10:
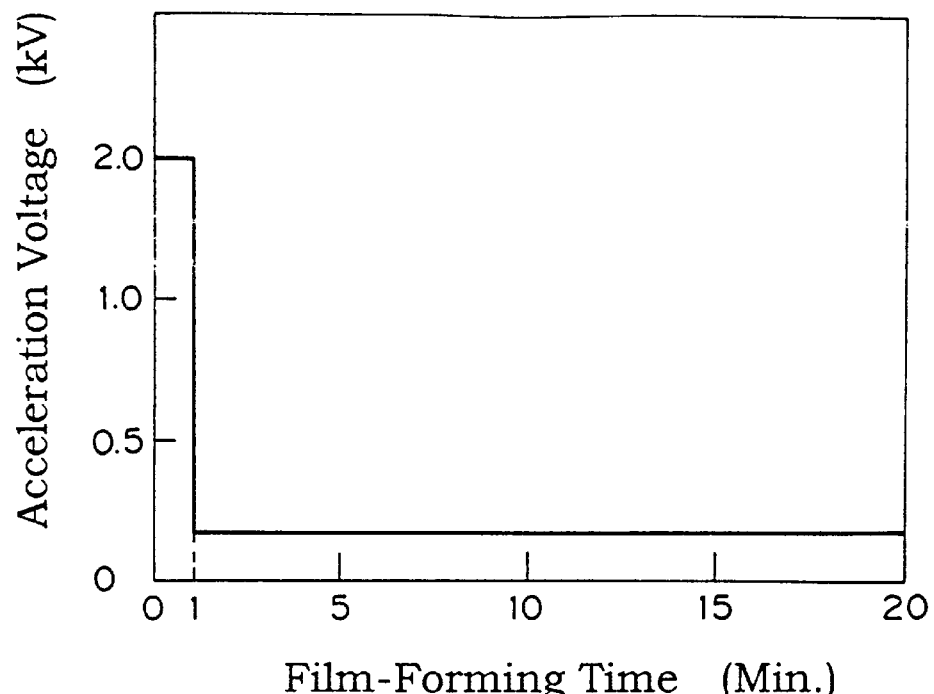
FIG. 10 is a graph showing a second exemplary pattern of an acceleration voltage varied with film-forming time for application to a grid in accordance with another embodiment of the present invention.
Figure 11:
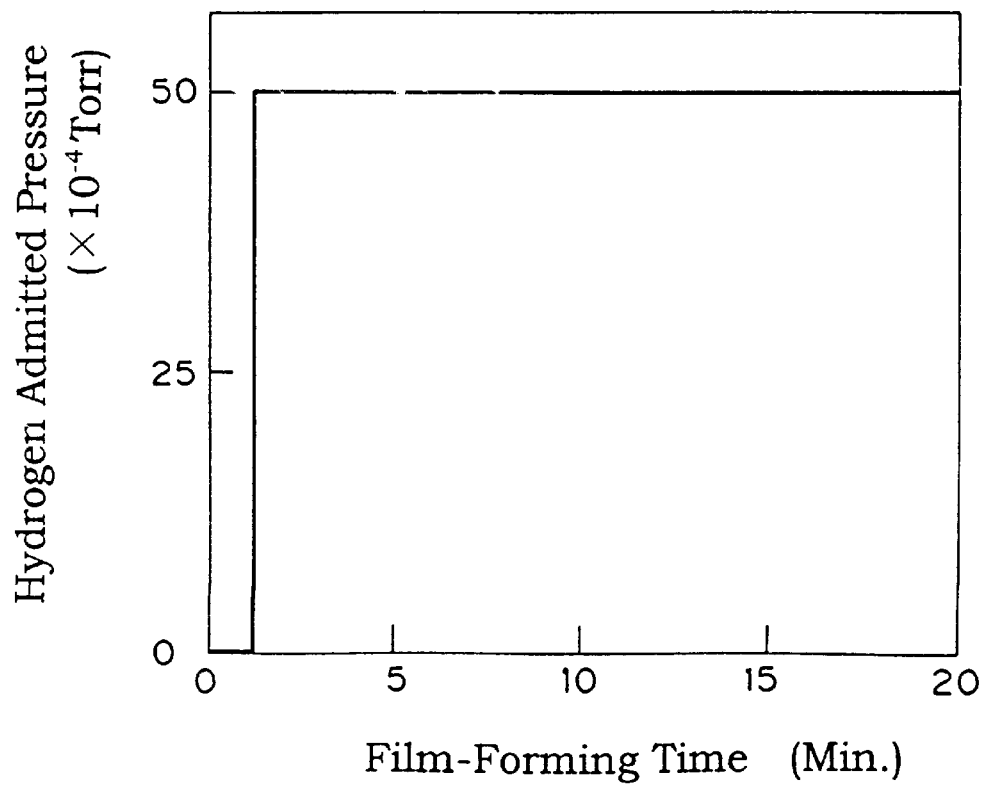
FIG. 11 is a graph showing a second exemplary pattern of a supply pressure, varied with film-forming time, to which a hydrogen gas is admitted in a reaction system in accordance with another embodiment of the present invention.

Next, the varying acceleration voltage is applied to the grid 19 in such a controlled fashion that it is maintained at 2 kV for the first one minute period at the initial stage of film formation and thereafter maintained at 200 V until the completion of film formation, as shown in FIG. 10. Concurrently, an $H_2$ gas is introduced through the gas inlet line 15 into the plasma generation chamber 14. As shown in FIG. 11, the $H_2$ gas supply is commenced after the lapse of one minute period at the initial stage of film formation and thereafter maintained at $5.0 \times 10^{-3}$ Torr. until the completion of film formation.

A hard carbon thin film is thus formed on the substrate 10. The obtained hard carbon thin film was measured for the $sp^2/sp^3$ ratios in its thickness direction by an electron energy loss spectroscopy (EELS). As a result, the $sp^2/sp^3$ ratio was found to be 3 for the substrate-neighboring film portion formed during the first one minute period at the initial stage of film formation, while the $sp^2/sp^3$ ratio was found to be zero for the remaining overlying film portion in which the C—C bonding was essentially devoid of $sp^2$ and predominantly $sp^3$. Also, the substrate-neighboring film portion was found as comprising amorphous diamond-like carbon while the remaining overlying film portion as comprising crystalline diamond carbon.

The surface portion of the hard carbon thin film obtained was measured for hardness to reveal a value of 8000 Hv. For comparative purposes, the acceleration voltage applied to the grid was maintained at 2 kV from the start till the completion of film formation to form a hard carbon thin film of Comparative Example 2-1 which was measured for hardness to reveal a value of 4000 Hv.

Also, in order to evaluate the adherence of the obtained hard carbon thin film to the substrate, a constant load (2 kg) indentation test was carried out using a Vickers penetrator. Fifty sample pieces were used for the test, and the number of sample pieces which showed delamination was counted as indicating the level of adherence of the hard carbon thin film. For comparative purposes, a hard carbon thin film of Comparative Example 2-2 was formed with no acceleration voltage applied to the grid during film formation, which was duly subjected to the indentation test using a Vickers penetrator as similar to the above. The number of sample pieces which showed delamination was found to be 0 for the hard carbon thin film of Example 2 according to the present invention, and 26 for the hard carbon thin film of Comparative Example 2-2.

As can be appreciated from the foregoing, in addition to being high in hardness, the hard carbon thin film in accordance with the present invention is excellent in adherence.

EXAMPLE 3

The apparatus shown in FIG. 7 is employed to form a hard carbon thin film having a graded structure in which the $sp^2/sp^3$ ratio decreases continuously in a uniform manner in a thickness direction of the film, i.e., toward its surface from a film/substrate interface.

The vacuum chamber 18 is first evacuated to a pressure of $10^{-5}10^{-7}$ Torr. Then, Ar and $CH_4$ gases are introduced into the plasma generation chamber 14 at respective pressures of $2.5 \times 10^{-4}$ Torr. and $3.0 \times 10^{-4}$ Torr. to convert them into respective gas plasmas within the plasma generation chamber 14.

The constant acceleration voltage of 1 kV is applied to the grid 19 during film formation.

Figure 12:
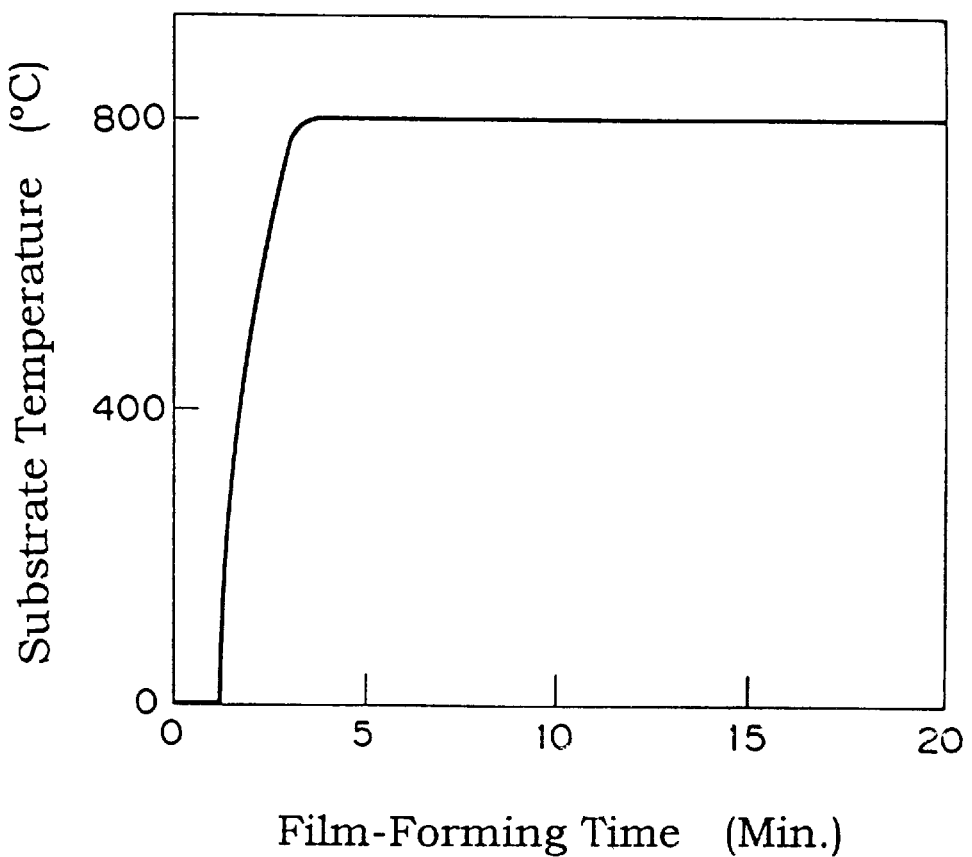
FIG. 12 is a graph showing a substrate temperature varied with film-forming time in accordance with one embodiment of the present invention.

As shown in FIG. 12, a substrate temperature is set at 20° C. (room temperature) for the first one minute period at the initial stage of film formation. After the one minute period, heating is applied to increase the substrate temperature so that it approaches about 800° C. when 3 minutes elapse from the start of film formation. The substrate temperature is thereafter maintained at 800° C. until the completion of film formation. Besides, an $H_2$ gas is introduced into the plasma generation chamber 14, which is maintained at $5.0 \times 10^{-3}$ Torr. during film formation.

A hard carbon thin film is thus formed on the substrate 10. The obtained hard carbon thin film was measured for the $sp^2/sp^3$ ratios in its thickness direction by an electron energy loss spectroscopy (EELS). As a result, the $sp^2/sp^3$ ratio was found to be 3 for the substrate-neighboring film portion formed during the first one minute period at the beginning of film formation, while the $sp^2/sp^3$ ratio was found to be zero for the remaining overlying film portion in which the C—C bonding was essentially devoid of $sp^2$ and predominantly $sp^3$. Also, the substrate-neighboring film portion was found as comprising amorphous diamond-like carbon while the remaining overlying film portion as comprising crystalline diamond carbon.

The surface portion of the hard carbon thin film obtained was measured for hardness to reveal a hardness of 7000 Hv.

Also, in order to evaluate the adherence of the obtained hard carbon thin film to the substrate, a constant load (2 kg) indentation test was carried out using a Vickers penetrator. Fifty sample pieces were used for the test, and the number of sample pieces which showed delamination was counted as indicating the level of adherence of the hard carbon thin film. The results demonstrated that no sample piece showed delamination.

As can be appreciated from the foregoing, in addition to being high in hardness, the hard carbon thin film in accordance with the present invention is excellent in adherence.

EXAMPLE 4

In this Example, the apparatus shown in FIG. 7 is employed to form a hard carbon thin film having a graded structure in which the $sp^2/sp^3$ ratio once decreases from a substrate/film interface to a minimum at an intermediate thickness of the thin film, and then increases therefrom toward a surface of the thin film.

The vacuum chamber 18 is first evacuated to a pressure of $10^{-5}$–$10^{-7}$ Torr. Then, Ar and $CH_4$ gases are introduced into the plasma generation chamber 14 at respective pressures of $2.5\times10^{-4}$ Torr. and $3.0\times10^{-4}$ Torr. to convert them into respective gas plasmas within the plasma generation chamber 14.

Figure 13:
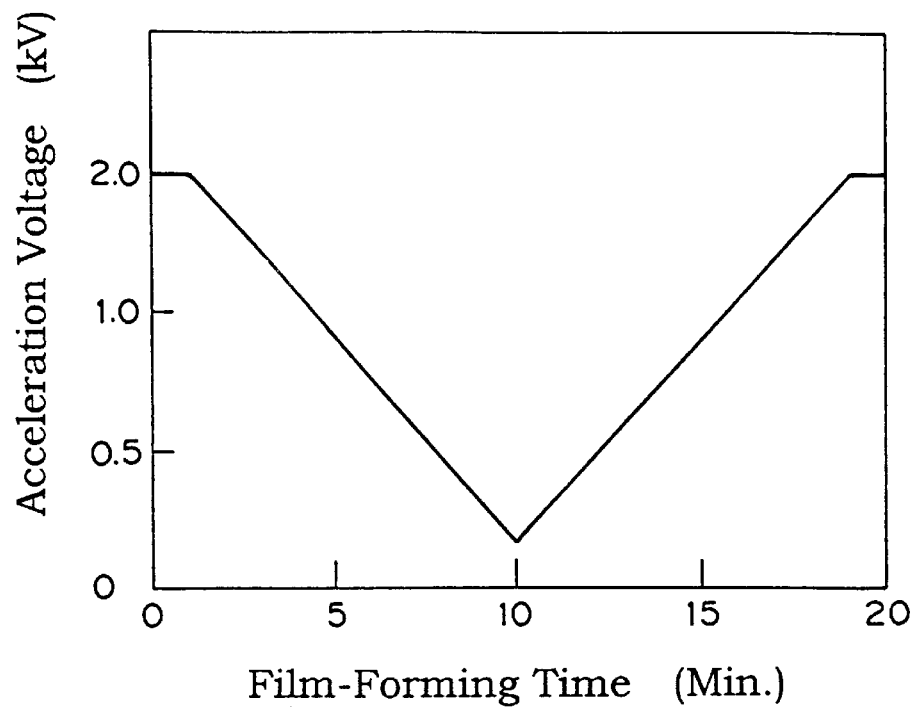
FIG. 13 is a graph showing a third exemplary pattern of an acceleration voltage varied with film-forming time for application to a grid in accordance with still another embodiment of the present invention.
Figure 14:
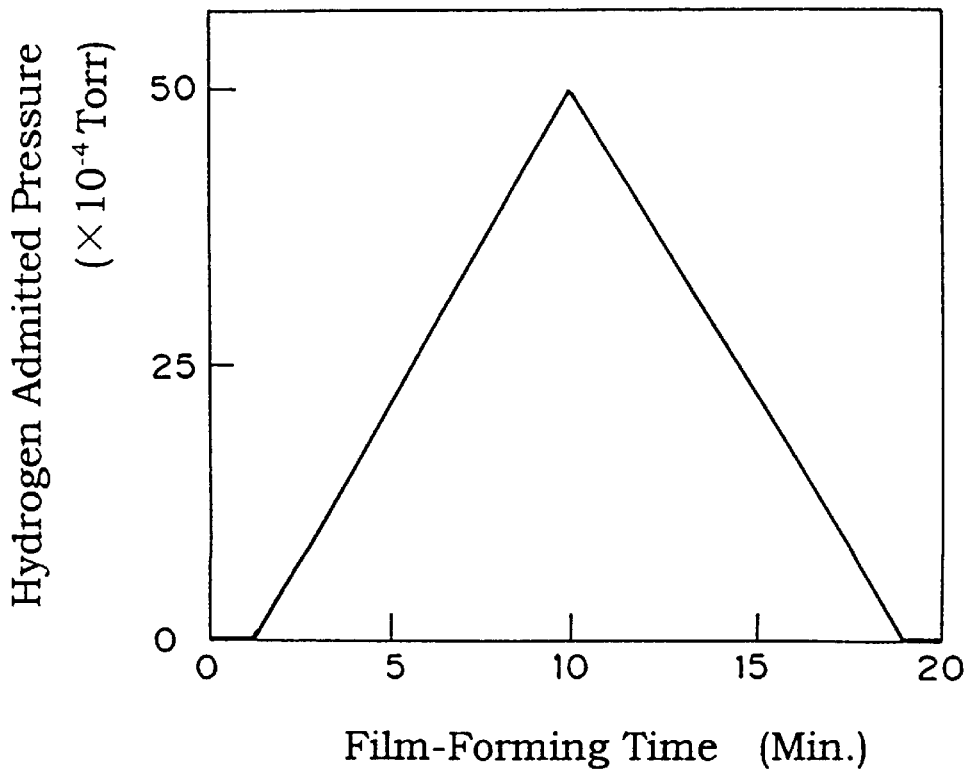
FIG. 14 is a graph showing a third exemplary pattern of a supply pressure, varied with film-forming time, to which a hydrogen gas is admitted in a reaction system in accordance with still another embodiment of the present invention.

Next, the varying acceleration voltage is applied to the grid 19 in such a controlled fashion that it is maintained at 2 kV for the first one minute period at the initial stage of film formation, decreased with film-forming time to a minimum value of 200 V when 10 minutes elapse from the start of film formation, and increased to a final value of 2 kV, as shown in FIG. 13. Concurrently, an $H_2$ gas is introduced into the plasma generation chamber 14 by varying its supply pressure in such a controlled fashion that it starts to increase with film-forming time after the lapse of one minute period at the initial stage of film formation, reaches a maximum value of $5.0\times10^{-3}$ Torr. when 10 minutes elapse from the start of film formation, and decreases with film-forming time to zero one minute before the completion of film formation, as shown in FIG. 14.

A surface portion of the hard carbon thin film thus formed was measured for hardness to reveal a value of 6000 Hv, and also determined for surface roughness ($R_{max}$) to reveal a value of 20 Å, when measured by a surface roughness tester, which accounted for an extremely smooth surface of the hard carbon thin film.

EXAMPLE 5

In this Example, the apparatus shown in FIG. 7 is employed to form a hard carbon thin film having a graded structure in which the $sp^2/sp^3$ ratio once decreases in a stepwise manner from a substrate/film interface to a minimum at an intermediate thickness of the thin film, and then increases therefrom in a stepwise manner toward a surface of the thin film.

The vacuum chamber 18 is first evacuated to a pressure of $10^{-5}$–$10^{-7}$ Torr. Then, Ar and $CH_4$ gases are introduced into the plasma generation chamber 14 at respective pressures of $2.5\times10^{-4}$ Torr. and $3.0\times10^{-4}$ Torr. to convert them into plasma within the plasma generation chamber 14.

Figure 15:
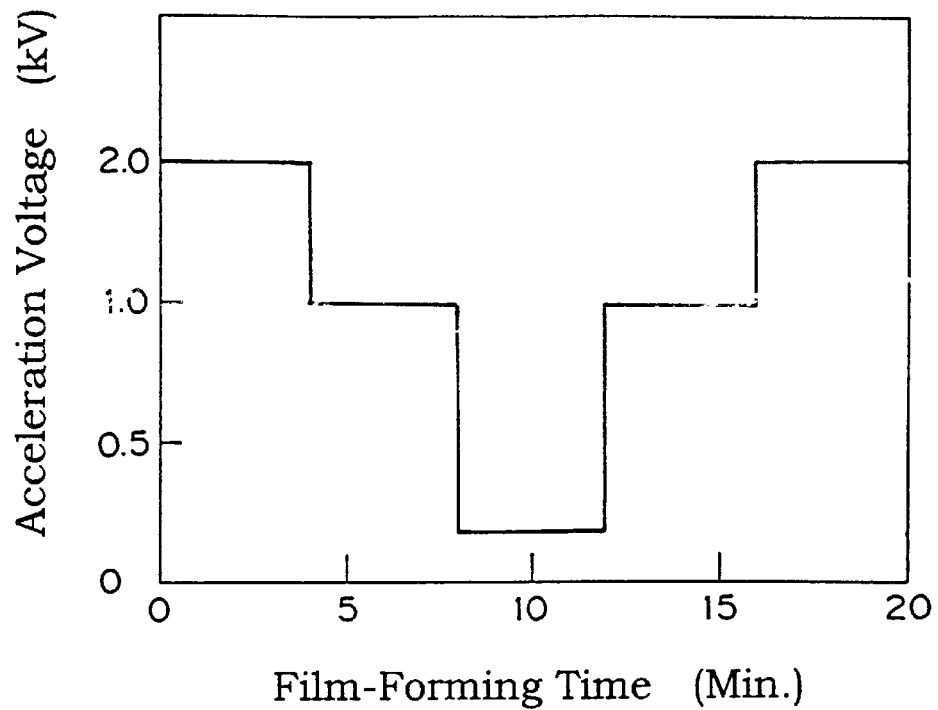
FIG. 15 is a graph showing a fourth exemplary pattern of an acceleration voltage varied with film-forming time for application to a grid in accordance with still another embodiment of the present invention.
Figure 16:
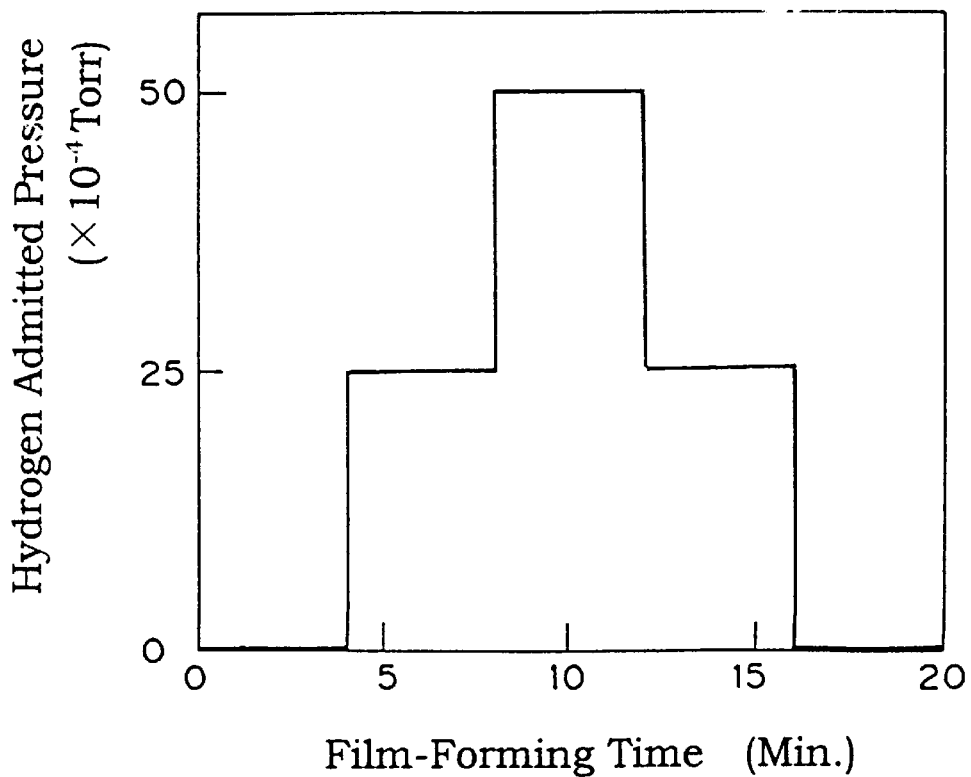
FIG. 16 is a graph showing a fourth exemplary pattern of a supply pressure, varied with film-forming time, to which a hydrogen gas is admitted in a reaction system in accordance with still another embodiment of the present invention.

Next, the varying acceleration voltage is applied to the grid 19 in such a stepwise manner that it is maintained at 2 KV during an initial 4-minute film-forming period, at 1 kV during a second 4-minute film-forming period, at 200 V during a third 4-minute film-forming period, at 1 kV during a fourth 4-minute film-forming period, and at 2 kV during a final 4-minute film-forming period, as shown in FIG. 15. Concurrently, an $H_2$ gas is introduced into the plasma generation chamber 14 by varying its supply pressure in such a stepwise manner that it is maintained at zero during the initial 4-minute film-forming period, at $2.5\times10^{-3}$ Torr. during the second 4-minute film-forming period, at $5.0\times10^{-3}$ Torr. during the third 4-minute film-forming period, at $2.5\times10^{-3}$ Torr. during the fourth 4-minute film-forming period, and at zero during a final 4-minute film-forming period, as shown in FIG. 16.

A surface portion of the hard carbon thin film thus formed was measured for hardness to reveal a value of 7000 Hv, and also determined for surface roughness ($R_{max}$) to reveal a value of 20 Å, when measured by a surface roughness tester, which accounted for an extremely smooth surface of the hard carbon thin film.

Although the ECR plasma CVD technique was employed in the above Examples, the other techniques such as an RF plasma CVD technique may also be employed to form the hard carbon thin film.

In order to vary the $sp^2/sp^3$ ratio in a thickness direction of the hard carbon thin film, several techniques are employed in the above Examples which include varying the acceleration voltage applied to the grid, varying the supply amount of hydrogen introduced into the reaction chamber, and varying the substrate temperature. Another technique may also be employed to vary the $sp^2/sp^3$ ratio in a thickness direction of the hard carbon thin film, which varies a negative bias voltage produced by application of a high-frequency power to the substrate. Alternatively, the $sp^2/sp^3$ ratio can be varied in a thickness direction of the hard carbon thin film by introducing oxygen into a reaction system to thereby controlling development of $sp^2$ C—C bonding.

Although the vane, a sliding part of a rotary compressor, is used as the substrate in the above Examples, the present invention is not limited thereto and other sliding parts including an electric shaver blade, a mask for screen deposition and a squeegee may also be used as the substrate. Also, the hard carbon thin film of the present invention is applicable for use as a constituent layer of a solar cell, a protective coating on a thin film magnetic head, and a protective or propagation film for surface acoustic wave devices.

Although the sliding part is described in the above Examples as comprising high-speed tool steel, the material type of the sliding part is not limited thereto. Applicable materials include other steels, iron-based alloys, cast iron (MoNiChro cast iron), aluminum alloys, carbons (aluminum-impregnated carbon), ceramics (oxides, nitrides and carbides of Ti, Al, Zr, Si, W, and Mo), Ni-based alloys, stainless steel.

In accordance with the first through fourth aspects of the present invention, the hard carbon thin film is provided which is high in hardness and assures excellent adherence to an underlying layer such as a substrate.

Figure 17:
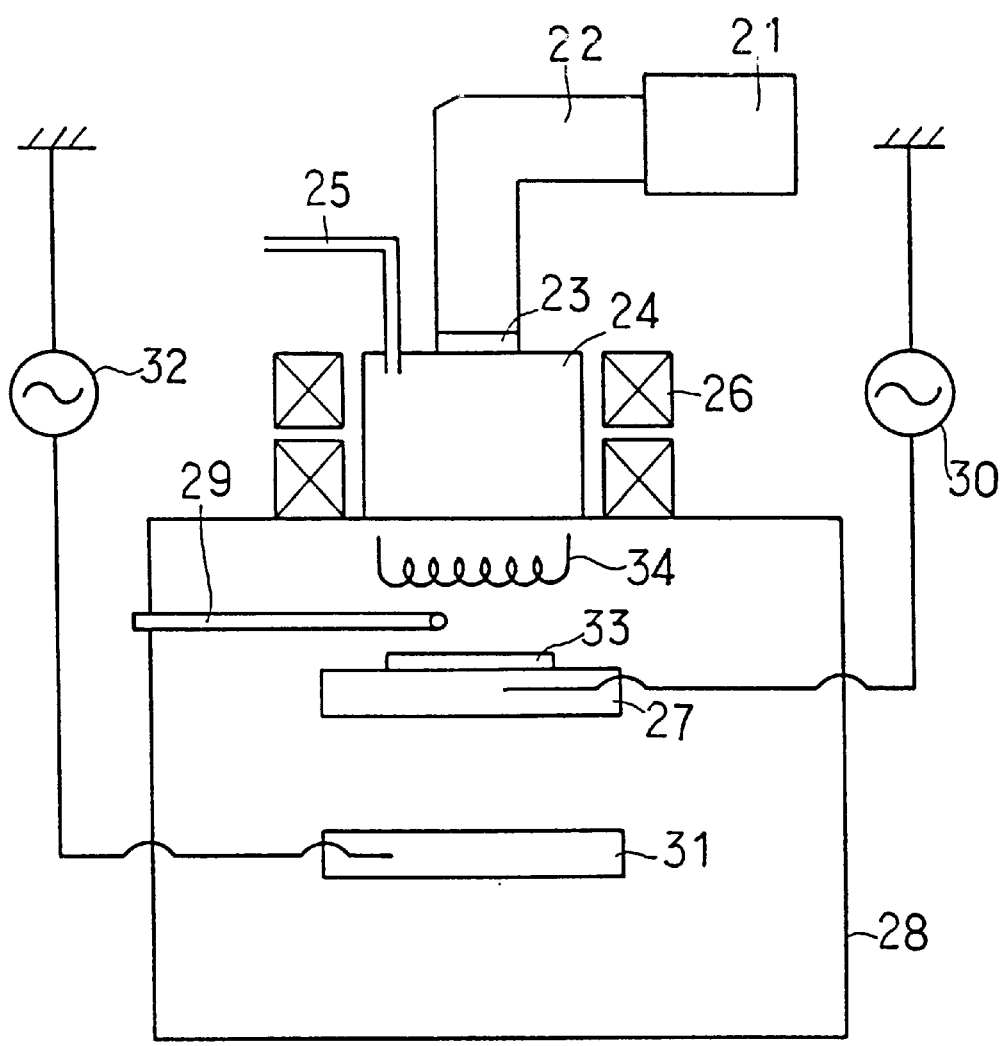
FIG. 17 is a schematic cross-sectional view of an exemplary film-forming apparatus for embodying a method in accordance with a fifth aspect of the present invention.

FIG. 17 is a schematic cross-sectional view showing an exemplary apparatus for forming a hard carbon thin film in accordance with the fifth aspect of the present invention. Referring to FIG. 17, a vacuum chamber 28 is provided with a plasma generation chamber 24 to which one end of a waveguide 22 is connected. A microwave supplying means 21 is mounted to another end of the waveguide 22. A microwave generated in the microwave supplying means 21 passes through the waveguide 22 and a microwave inlet window 23 to be guided into the plasma generation chamber 24. The plasma generation chamber 24 is provided with a discharge gas inlet line 25 for introducing a discharge gas such as argon (Ar) into the plasma generation chamber 24. A plurality of plasma magnetic field generators 26 are mounted circumferentially of the plasma generation chamber 24. A high density plasma can be generated within the plasma generation chamber 24 through the interaction of a high-frequency magnetic field produced by the microwave and a magnetic field generated by the plasma magnetic field generators 26. The vacuum chamber 28 encloses a substrate holder 27 to which a high-frequency power source 30 is connected for applying a bias voltage to a substrate during film formation.

A substrate 33 is held on the substrate holder 27. A leading end of a raw material gas supply tube 29 is located above the substrate holder 27 for introducing into the vacuum chamber 28 a material gas for use in formation of a hard carbon thin film. Also disposed above the substrate 33 is a filament 34 for thermally decomposing the raw material gas supplied from the raw material gas supply tube 29.

Positioned below the substrate holder 27 is a target 31 (Si target in this Example) for use in formation of an interlayer. A high-frequency power source 32 is connected to the target 31 to enable generation of an Ar plasma between the substrate holder 27 and the target 31.

Examples will now be given below which utilize the apparatus shown in FIG. 17 in forming hard carbon thin films.

EXAMPLE 6

Figure 18:
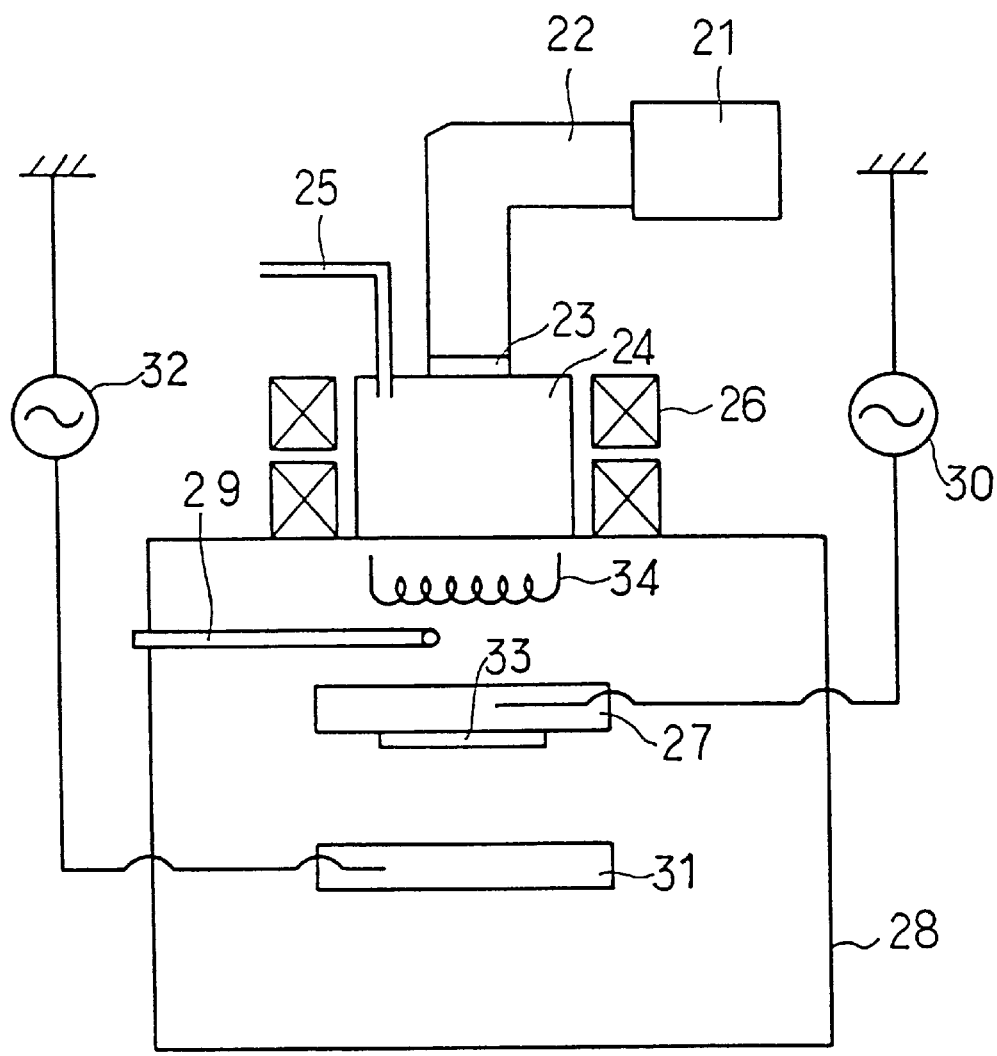
FIG. 18 is a schematic cross-sectional view of the apparatus of FIG. 17 wherein a substrate holder is so rotated as for a substrate to face toward a target.

A silica glass is used as the substrate 33. Si is first deposited on the substrate 33 to form an interlayer. As shown in FIG. 18, the substrate holder 27 is rotated so that the substrate 33 is oriented to face toward the target 31 located below the substrate 33. In this arrangement, the vacuum chamber 28 is evacuated to a pressure of $10^{-5}$–$10^{-7}$ Torr. Then, the Ar gas is supplied at $5.7 \times 10^{-4}$ Torr. from the raw material gas supply tube 29. The high-frequency power source 32 supplies an RF voltage to the target 31 to generate the Ar plasma between the target 31 and the substrate holder 27. The target 31 is sputtered by ions in the plasma to form the interlayer (film thickness of 300 Å) comprised of Si.

Next, the substrate holder 27 is again rotated to return to its initial position as shown in FIG. 17. In such a position, $CH_4$ and $H_2$ gases are supplied from the raw material gas supply tube 29 at $5.0 \times 10^{-4}$ Torr. and $2.0 \times 10^{-3}$ Torr., respectively. A voltage of 13 V is applied to the filament 34 which is accordingly heated to a temperature of about 2000° C. Upon exposure to heat from the filament 34, the $CH_4$ gas is thermally decomposed to result in formation of a diamond thin film on the substrate 33. The film formation is continued for about 5 minutes so that the diamond film is formed on the substrate 33 to a thickness of about 500 Å, wherein the substrate temperature is increased to 400° C.

The subsequent reduction in the voltage applied to the filament allows the filament temperature to drop to 1000° C. from about 2000° C. The microwave supplying means 21 supplies a microwave at 2.45 GHz and 100 W. Concurrently, the Ar gas is supplied at $5.7 \times 10^{-4}$ Torr. from the discharge gas inlet line 25 to generate the Ar plasma within the plasma generation chamber 24. The Ar plasma is directed onto the substrate 33. Simultaneously with this process, the high-frequency power source 30 applies a 13.56 MHz RF voltage to the substrate holder 27 so that a self-bias voltage of −50 V is generated in the substrate, and the $CH_4$ and $H_2$ gases are supplied at $1.3 \times 10^{-3}$ Torr. and $2.0 \times 10^{-2}$ Torr., respectively from the raw material gas supply tube 29. The $CH_4$ gas is decomposed by the Ar plasma directed toward the substrate 33, and a diamond thin film is formed on the substrate 33. In this manner, the diamond thin film is deposited to a thickness of about 2000 Å. As a result, the diamond thin film is formed on the substrate 33 to a total thickness of about 2500 Å. The substrate temperature is in the range of 250–300° C. during this process.

The results of Raman spectroscopic analysis revealed a sharp peak at 1330 $cm^{-1}$ to demonstrate a typical diamond nature of the diamond thin film formed on the substrate 33. This diamond thin film was also measured for hardness and surface roughness, the results of which are given in Table 1. The surface roughness was measured using a contact-type surface profile tester.

EXAMPLE 7

The procedure of Example 6 was repeated to form a thin film, except that the supply pressure of $H_2$ gas was reduced to a half of that used in Example 6. The results of Raman spectroscopic analysis revealed the significant increase in amount of amorphous components in the thin film to demonstrate its structural shift, i.e. from a polycrystalline diamond thin film to a thin film containing amorphous components. Besides, the thin film obtained was measured for hardness and surface roughness, the results of which are given in Table 1.

COMPARATIVE EXAMPLE 3

The diamond thin-film forming process of Example 6, which relied the thermal decomposition of the $CH_4$ gas on its exposure to heat from the filament 34, was continued for about 25 minutes to form a diamond thin film having a thickness of about 2500 Å on the substrate 33, wherein the substrate temperature approached about 1000° C. The diamond nature of the thin film obtained was confirmed by Raman spectrum. The thin film obtained was measured for hardness and surface roughness, the results of which are given in Table 1.

TABLE 1

|  | Vickers Hardness (Hv) | Surface Roughness (μm) |
| --- | --- | --- |
| Exp. 6 | 8000 | 0.1 |
| Exp. 7 | 5000 | 0.05 |
| Comp.Exp. 3 | 9000 | 2 |

As can be readily appreciated from Table 1, the film formation through thermal decomposition of the raw material gas is able to provide a very hard diamond thin film with a smooth surface when followed by the film formation through both thermal and ECR plasma-assisted decomposition of the raw material gas. Also, although the substrate temperature approached 1000° C. in Comparative Example 3, as stated earlier, the maximum substrate temperature was 400° C. in Example 6, which demonstrates the ability of the combined film forming process to form the diamond thin films at lower temperatures.

Also, it will be appreciated from the comparison between Examples 6 and 7 that the regulated supply of the hydrogen gas enables the control of amorphous components in the hard carbon thin films. That is, as the larger amount of hydrogen gas is supplied, the more crystalline components are incorporated in the resulting hard carbon thin film. Stated differently, as the smaller amount of hydrogen gas is supplied, the more amorphous components are incorporated in the resulting hard carbon thin film.

EXAMPLE 8

In this example, subsequent to formation of a diamond thin film by using a hot filament for thermally decomposing a raw material gas, the ECR plasma-assisted decomposition of the raw material gas was solely effected to form an additional thin film. That is, the procedure of Example 6 was repeated to form a hard carbon thin film, except that the substrate was heated to about 400° C. using a heater accommodated in the substrate holder 27, instead of applying the voltage to the filament 34 for heating thereof. The results of Raman spectroscopic analysis revealed a sharp peak at 1330 $cm^{-1}$ to demonstrate a typical diamond nature of the hard carbon thin film obtained. This diamond thin film was measured for hardness and surface roughness to exhibit values of 4500 Hv and 0.01 μm, respectively.

EXAMPLE 9

The procedure of Example 8 was followed to form a thin film, with the exception that the substrate temperature was maintained at room temperature during the film formation through the ECR plasma-assisted decomposition of the material gas, i.e., no heating was applied to the substrate. The results of Raman spectroscopic analysis revealed a main peak at 1530 $cm^{-1}$ and a shoulder peak at 1400 $cm^{-1}$ to demonstrate a typical diamond-like nature of the thin film obtained. The diamond-like thin film obtained was measured for hardness and surface roughness, the results of which are given in Table 2.

COMPARATIVE EXAMPLE 4

The procedure of Example 9 was followed to form a thin film, except that the diamond film forming process using a hot filament for thermally decomposing the raw material gas was eliminated, an Si interlayer was formed directly on the substrate, and the substrate temperature was maintained at room temperature during the film forming process through the ECR plasma-assisted decomposing of the material gas to form a thin film having a thickness of about 2500 Å on the Si interlayer. The thin film obtained was determined as being the diamond-like thin film. The hardness and surface roughness of the thin film obtained are shown in Table 2.

TABLE 2

|  | Vickers Hardness (Hv) | Surface Roughness (μm) |
|---|---|---|
| Exp. 9 | 3500 | 0.005 |
| Comp.Exp. 4 | 3000 | 0.004 |

As can be readily appreciated from Table 2, the additional film formation utilizing the ECR plasma subsequent to the film formation through the thermal decomposition of raw material gas, in accordance with the fifth aspect of the present invention, enables the provision of a very hard diamond-like thin film.

EXAMPLE 10

The procedure of Example 6 was repeated to form a diamond thin film, except that a voltage of 7 V was applied to the filament. The results of Raman spectroscopic analysis demonstrated that the thin film obtained contained a higher proportion of amorphous components compared to the thin film obtained in Example 6. The thin film obtained was measured for hardness and surface roughness to exhibit values of 6000 Hv and 0.07 μm, respectively.

EXAMPLE 11

In this Example, the Ar and nitrogen gasses equal in amount were supplied respectively at $5.7 \times 10^{-4}$ Torr. to convert them into gas plasmas which sputtered the Si target to form an Si nitride interlayer. That is, the procedure of Example 11 was followed to form a diamond thin film, except that an Si nitride interlayer, instead of the Si interlayer, was formed. The hardness and surface roughness of the diamond thin film obtained were 8000 Hv and 0.1 μm, respectively.

EXAMPLE 12

In this Example, the Ar and oxygen gasses equal in amount were supplied respectively at $5.7 \times 10^{-4}$ Torr. to convert them into gas plasmas which sputtered the Si target to form an Si oxide interlayer. That is, the procedure of Example 11 was followed to form a diamond thin film, except that an Si oxide interlayer, instead of the Si interlayer, was formed. The hardness and surface roughness of the diamond thin film obtained were 8000 Hv and 0.1 μm, respectively.

EXAMPLE 13

In this Example, a hard carbon thin film having a graded structure of varied $sp^2/sp^3$ ratios in accordance with the first aspect of the present invention was formed utilizing a method in accordance with the fifth aspect of the present invention.

First, the vacuum chamber 28 was evacuated to a pressure of $10^{-5}$–$10^{-7}$ Torr. Then, the Ar gas was supplied at $5.7 \times 10^{-4}$ Torr. to produce the Ar plasma between the target 31 and the substrate holder 27 so that ions in the plasma sputtered the Si target, forming an Si interlayer.

After the Si interlayer forming process using a magnetron sputtering technique was terminated, the Ar gas was supplied at $5.7 \times 10^{-4}$ Torr. from the discharge gas inlet line 25 of the ECR plasma generator. Concurrently, the microwave supplying means 21 supplied a microwave at 2.45 GHz and 100 W to generate the Ar plasma within the plasma generation chamber 24 for direction onto the substrate 33. Simultaneously with this process, the high-frequency power source 30 applied a 13.56 MHz RF voltage to the substrate holder 27 so that a self-bias voltage of −50 V was generated in the substrate 33, and the $CH_4$ and $H_2$ gases were supplied at $1.3 \times 10^{-3}$ Torr. and $2.0 \times 10^{-2}$ Torr., respectively from the reactive gas supply tube 29. As a result, a hard carbon thin film was formed to a thickness of 1000 Å.

Subsequent to termination of the above film-forming process using the plasma, the $CH_4$ and $H_2$ gases were supplied at $5.0 \times 10^{-4}$ Torr. and $2.0 \times 10^{-3}$ Torr., respectively from the reactive gas supply tube 29, while a voltage of 13 V was applied to the filament. The process was continued for about 10 minutes to form a diamond thin film having a thickness of about 1000 Å on the substrate 33.

Consequently, the hard carbon thin film was formed to a total thickness of 2000° C.

In this Example, the hard carbon thin film thus obtained revealed the structural transition from a thin film structure containing amorphous components to a polycrystalline diamond thin film structure, i.e. the structural transition from an $sp^2$-rich film structure to an $sp^3$-rich film structure in its thickness direction from the substrate/film interface toward its surface.

In the above Example 7, the reduction of the $H_2$ gas supply pressure served to increase in amount of the amorphous components in the hard carbon thin film. However, the similar results can be attained by reducing the ECR plasma density. It is therefore possible to control film properties by adjusting the plasma density.

Although it is described in the above Examples to form the interlayer on which the hard carbon thin film is subsequently formed, the fifth aspect of the present invention is not limited thereto, and includes the case where the hard carbon film is formed directly on the substrate.

Also, although the above Examples specify the thermal decomposition of raw material gases as being effected by exposure to the hot filament, the fifth aspect of the present invention is not limited thereto.

Also, although the above Examples employ the film-forming technique solely through thermal decomposition of reactive gases in a first film-forming step for forming an initial hard carbon thin film, the fifth aspect of the present invention is not limited thereto, and includes an exemplary case where the first film-forming step relies the film formation on the decomposition of reactive gases by both heat and plasma. Also, where the film-forming process through decomposition of the reactive gases by both heat and plasma is carried out in both the first and second film-forming steps, the film-forming conditions respectively in the first and second steps may be varied from each other to impart different proportions of crystalline and non-crystalline components to the resulting hard carbon thin films.

Figure 19:
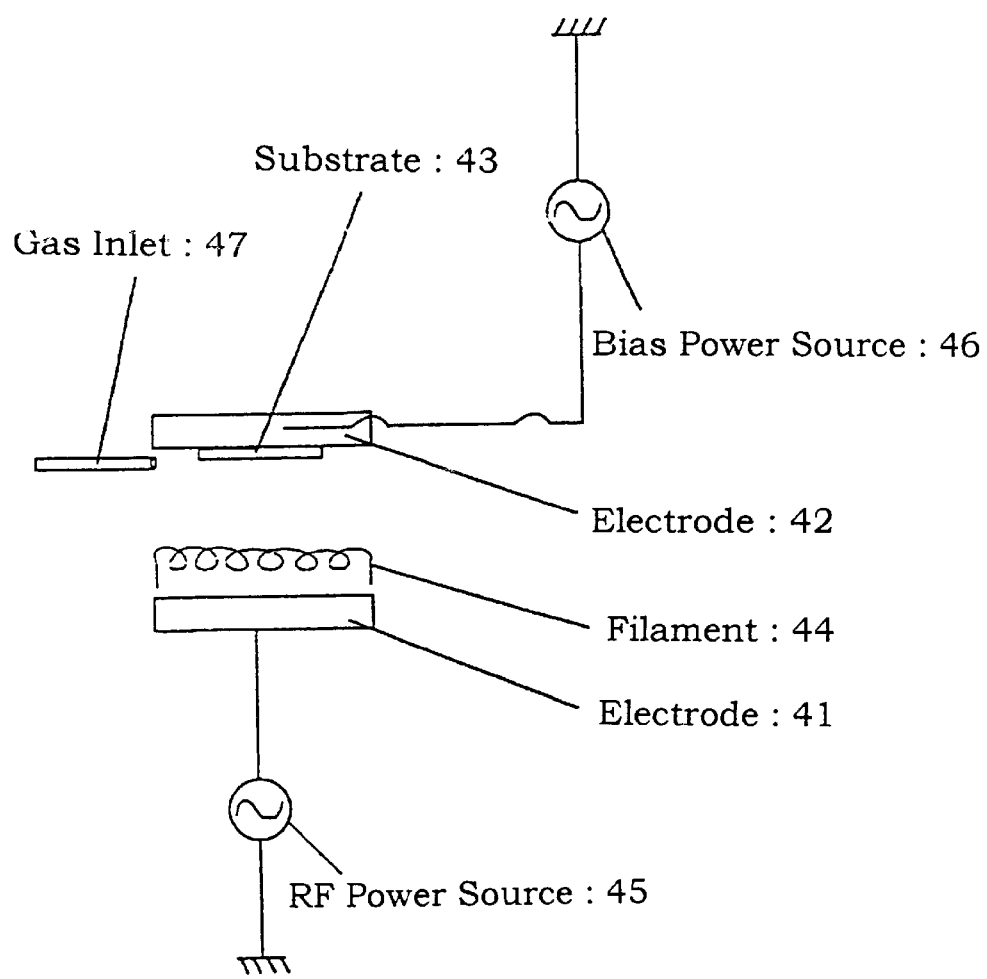
FIG. 19 is a schematic cross-sectional view of another exemplary film-forming apparatus for embodying the method in accordance with the fifth aspect of the present invention.

FIG. 19 is a schematic cross-sectional view showing another exemplary apparatus for forming a hard carbon thin film in accordance with the fifth aspect of the present invention. This apparatus is so constructed to be able to carry out a parallel-plate plasma CVD process. This apparatus is also enclosed in a vacuum chamber (not shown). As shown in FIG. 19, an electrode 41 is connected to a high-frequency power source 45. A substrate 43 is placed on an opposite electrode 42 to which a high-frequency power source 46 is connected for supplying a bias voltage to the substrate 43. A raw material gas inlet 47 is located in the vicinity of the substrate 43 for supplying the raw material gas therefrom. Disposed between the electrode 41 and the opposite electrode 42 is a filament 44 for exposing heat to the material gas to cause decomposition thereof.

The present invention is applicable not only to the ECR plasma CVD method, but also to the parallel-plate plasma CVD method as can be embodied using the apparatus of FIG. 19.

In accordance with the fifth aspect of the present invention, the proportion of crystalline and non-crystalline components in a hard carbon thin film can be adjusted to provide controlled film properties, e.g. the controlled hardness and surface roughness of the hard carbon thin film. This not only permits formation of a crystalline diamond thin film with a smooth surface at relatively low temperatures, but also permits formation of a very hard amorphous diamond-like thin film.

Figure 20:
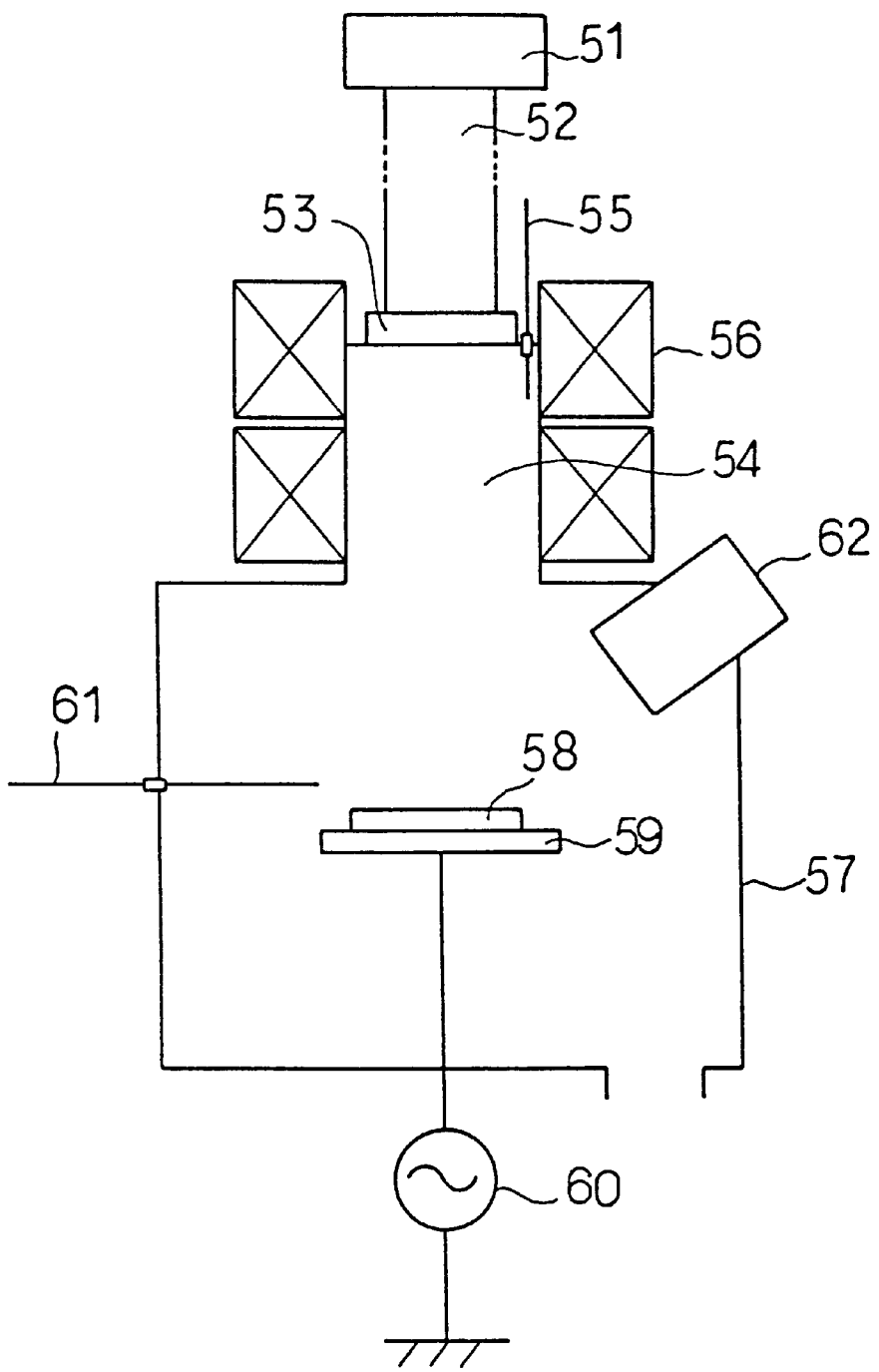
FIG. 20 is a schematic cross-sectional view of an exemplary amorphous coating forming apparatus for embodying a method in accordance with a sixth aspect of the present invention.

FIG. 20 is a schematic cross-sectional view showing an exemplary apparatus for forming an amorphous carbon coating in accordance with the sixth aspect of the present invention. The apparatus is capable of carrying out the ECR plasma CVD process to form the amorphous carbon coating, e.g. a diamond-like thin film, and is adapted to be able to produce and emit ions or plasmas for surface cleaning.

Referring to FIG. 20, an upper interior portion of a vacuum chamber 57 defines a plasma generation chamber 54 to which a microwave generator 51 is connected through a waveguide 52. A microwave inlet window 53 is disposed at the connection between the waveguide 52 and the plasma generation chamber 54. The plasma generation chamber 54 is also equipped with a discharge gas inlet line 55 for introducing a discharge gas such as argon (Ar) into the plasma generation chamber 54. Plural plasma magnetic field generators 56 are mounted circumferentially of the plasma generation chamber 54.

A reaction chamber defined interior of the vacuum chamber 57 includes a substrate holder 59 and is connected to a reactive gas inlet line 61 for introducing a reactive gas into the vacuum chamber 57. A substrate 58 is held on the substrate holder 59 to which a high-frequency power source is connected. An ion gun 62 is mounted interior of the vacuum chamber 57 for emitting Ar ions toward the substrate 58.

The formation of the diamond-like thin film, as illustrative of the amorphous carbon coating, utilizing the apparatus shown in FIG. 20 is explained by way of specific examples which follow.

EXAMPLE 14

First, the vacuum chamber 57 is evacuated to a pressure of $10^{-5}-10^{-7}$ Torr. Then, the ion gun is operated to emit Ar ions to the substrate 58 so that the substrate 58 is irradiated with the Ar ions for a predetermined time period. The ion emitting condition is set at an ion current density of 0.3 MA/cm$^2$, an acceleration voltage of 400 eV, and an Ar gas partial pressure of $3\times10^{-5}$ Torr. In this example, the Ar ion irradiation was continued for 5 minutes, 10 minutes, 20 minutes, or 30 minutes.

After the ion gun operation is discontinued, the Ar gas is supplied at $5.7\times10^{-4}$ Torr. from the discharge gas inlet line 55 of the ECR plasma generator. Concurrently, the microwave generator 51 supplies a microwave at 2.45 GHz and 200 W to generate the Ar plasma within the plasma generation chamber 54 for direction onto the substrate 58. The CH$_4$ gas is supplied at $1.3\times10^{-3}$ Torr. from the reactive gas inlet line 61. The CH$_4$ gas supplied from the reactive gas inlet line 61 is decomposed due to the action of the Ar plasma to produce film-forming species which are converted into highly reactive ions or neutral active species for acceleration onto a surface of the substrate 58. As a result, a diamond-like thin film is formed on the substrate 58. During the above process, the high-frequency power source 60 applies a 13.56 MHz RF voltage to the substrate holder 59 so that a self-bias of −50 V is generated in the substrate 58.

The above leads to formation of the diamond-like thin film, i.e. the amorphous carbon coating on the substrate 58. The amorphous carbon coating is formed to a thickness of 100 Å, 500 Å, or 1000 Å.

For comparative purposes, the above procedure is followed to form on the substrate 58 an amorphous carbon coating to a thickness of 100 Å, 500 Å, or 1000 Å, except that no ion irradiation was effected.

The amorphous carbon coatings thus obtained were measured for surface roughness. The surface roughness was measured by a stylus-based testing (load: 30 mg, stylus travel speed: 25 sec/mm) using a stylus having a spherical point with a radius of about 2.5 $\mu$m, the results of which were indicated by h$_{rms}$ (root-mean-square deviation).

Figure 21:
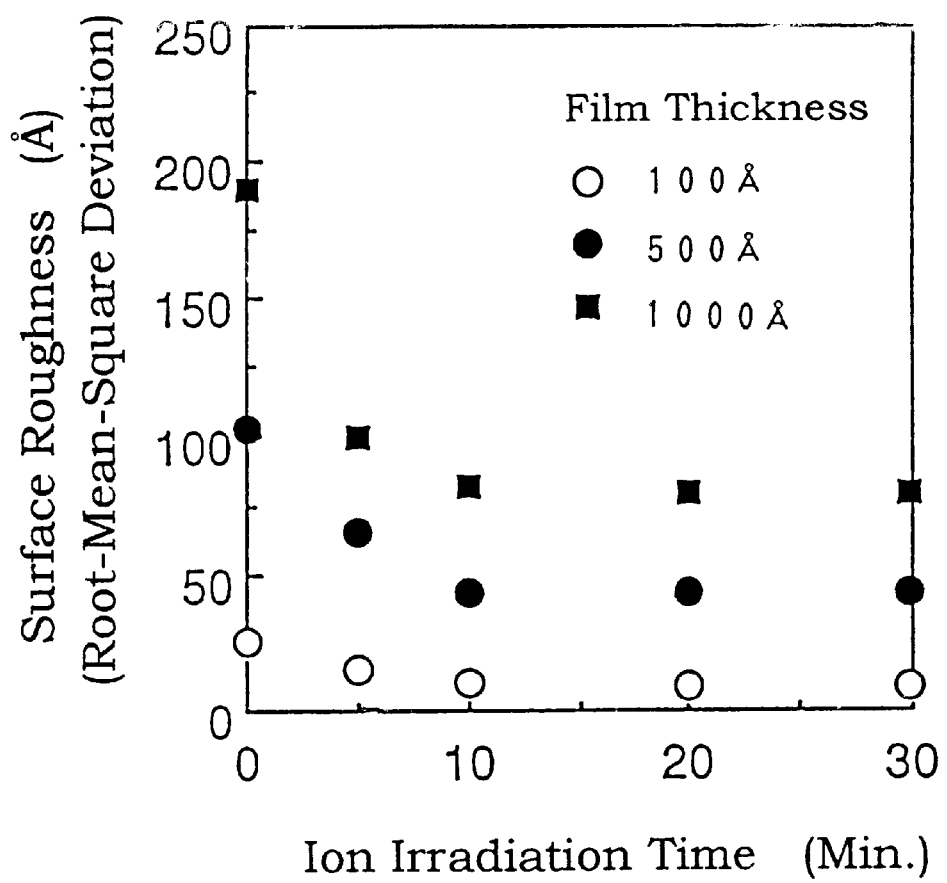
FIG. 21 is a graph showing a relationship between surface roughness of amorphous carbon coatings formed in accordance with the sixth aspect of the present invention and a time period during which a substrate is exposed to ion radiation for cleaning thereof prior to formation of the amorphous carbon coatings.

FIG. 21 is a graph showing the surface roughness of respective amorphous carbon coatings having different thicknesses. As can be readily appreciated from FIG. 21, the exposure of the substrate to ions emitted, prior to coating formation thereon, serves to impart a marked reduction in surface roughness to the resulting amorphous carbon coatings. The surface roughness of the resulting amorphous carbon coatings is demonstrated as being maintained essentially constant if the ion irradiation is continued for the period exceeding 10 minutes. As also apparent from FIG. 21, when the cleaning treatment of substrate surface was performed prior to coating formation thereon in accordance with the sixth aspect of the present invention, the surface roughness of the resulting amorphous carbon coating was reduced to one fifth or less of the thickness thereof.

Next, among the amorphous carbon coatings obtained, the coatings formed on the substrate after irradiated with ions for 10 minutes were measured for coefficient of kinetic friction using a load of 20 g and an alumina ball of 10 mm in diameter. For comparative purposes, the amorphous carbon coatings formed on the substrate which had not been exposed to ions prior to coating formation thereon were also measured for coefficient of kinetic friction. The measurement results are given in Table 3. In Table 3, "with ion irradiation" is intended to refer to this Example, and "without ion irradiation" to Comparative Example.

TABLE 3

| | | Film Thickness | | |
|---|---|---|---|---|
| | | 100Å | 500Å | 1000Å |
| Friction Coefficient | With Ion Irradiation | 0.10 | 0.15 | 0.13 |
| | Without Ion Irradiation | 0.12 | 0.18 | 0.17 |

As clearly shown in Table 3, the amorphous carbon coatings formed on the respective substrates which were cleaned at surfaces thereof by irradiation with ions prior to application of the coatings thereon exhibit lower friction coefficients at different film thicknesses compared to those of Comparative Example.

EXAMPLE 15

In this Example, the ion irradiation was effected during coating formation to clean or etch a coating growth surface by bombardment of high-velocity ions.

First, the vacuum chamber 57 is evacuated to a pressure of $10^{-5}$–$10^{-7}$ Torr. Then, the ion gun is operated to emit Ar ions under the same condition as in Example 14 to irradiate the substrate 58 with the Ar ions.

Concurrently, the Ar gas is supplied at $5.7 \times 10^{-4}$ Torr. from the discharge gas inlet line 55 and the microwave generator 51 supplies a microwave at 2.45 GHz and 200 W to generate the Ar plasma within the plasma generation chamber 54 for direction onto the substrate 58. The $CH_4$ gas is supplied at $1.0 \times 10^{-3}$ Torr. from the reactive gas inlet line 61. The $CH_4$ gas supplied from the reactive gas inlet line 61 is decomposed due to the action of the Ar plasma to produce film-forming species which are converted into highly reactive ions or neutral active species for acceleration onto a surface of the substrate 58. As a result, an amorphous carbon coating is deposited on the substrate 58.

As analogously to Example 14, the high-frequency power source 60 applies a 13.56 MHz RF voltage to the substrate holder 59 so that a self-bias of –50 V is generated in the substrate 58 during the above process.

The amorphous carbon coating is formed to a thickness of 100 Å, 500 Å, or 1000 Å. The amorphous carbon coatings thus obtained were measured for surface roughness in the same manner as in Example 14, the results of which are given in Table 4. Also, for comparative purposes, the amorphous carbon coatings formed without ion irradiation during formation thereof were also measured for surface roughness, the results of which are also given in Table 4.

TABLE 4

| | | Film Thickness | | |
|---|---|---|---|---|
| | | 100Å | 500Å | 1000Å |
| Friction Coefficient | With Ion Irradiation | 10Å | 45Å | 88Å |
| | Without Ion Irradiation | 25Å | 115Å | 220Å |

As can be appreciated from Table 4, cleaning or etching the coating growth surface by exposure thereof to the Ar ions during coating formation, in accordance with the sixth aspect of the present invention, serves to impart reduced surface roughness, i.e. increased surface smoothness to the resulting amorphous carbon coating.

EXAMPLE 16

In this Example, a plasma treatment was performed to clean or etch the substrate surface.

First, the vacuum chamber 57 was evacuated to a pressure of $10^{-5}$–$10^{-7}$ Torr. Then, the Ar gas is supplied at $5.7 \times 10^{-4}$ Torr. from the discharge gas inlet line 55, while the microwave generator 51 supplies a microwave at 2.45 GHz and 200 W, to generate the Ar plasma within the plasma generation chamber 54. Concurrently, the high-frequency power source 60 applies a 13.56 MHz RF voltage to the substrate holder 59 so that a self-bias voltage of –50 V is generated in the substrate 58. The Ar plasma generated within the plasma generation chamber 54 is thereby accelerated onto a surface of the substrate 58 to effect cleaning of the substrate surface. After irradiation with the Ar plasma for 10 minutes, an amorphous carbon coating is formed on the substrate in the same manner as in Example 14.

The amorphous carbon coating is formed to a thickness of 100 Å, 500 Å, or 1000 Å. The amorphous carbon coatings thus obtained were measured for surface roughness in the same manner as in Example 14, the results of which are given in Table 5.

TABLE 5

| | | Film Thickness | | |
|---|---|---|---|---|
| | | 100Å | 500Å | 1000Å |
| Friction Coefficient | With Ion Irradiation | 10Å | 45Å | 88Å |
| | Without Ion Irradiation | 25Å | 115Å | 220Å |

As can be appreciated from Table 5, cleaning or etching the substrate surface by irradiation with the Ar plasma prior to coating formation thereon also serves to impart reduced surface roughness, i.e. increased surface smoothness to the resulting amorphous carbon coating.

In summary, the hard carbon thin films having excellent surface smoothness can be formed in accordance with the fifth or sixth aspect of the present invention, which accordingly have utilities as for coating materials and the others.

The hard carbon thin film formed in accordance with the present invention can provide excellent characteristics when applied, for example, to shaver blades, thin-film magnetic heads, magneto-optical disks, sliding parts for compressors, antireflection coatings for use in the manufacture of semiconductors, heat sinks for semiconductor devices, surface acoustic wave devices.

What is claimed is:

1. A hard carbon thin film arrangement comprising a hard carbon thin film having a surface and an interface opposite said surface with a thickness direction extending through said thin film from said interface to said surface, and having a graded carbon composition in which a ratio of $sp^2$ to $sp^3$ carbon-carbon bonding in said thin film decreases in said thickness direction from said interface to a minimum at an internal location of said thin film between said interface and said surface, and increases from said minimum at said internal location toward said surface of said thin film.

2. The hard carbon thin film arrangement of claim 11, wherein said thin film comprises at least two layers having respective individual $sp^2/sp^3$ carbon-carbon bonding ratios different from each other so that said ratio of $sp^2$ to $sp^3$ carbon-carbon bonding in said thin film decreases in said thickness direction in a stepwise manner from said interface to said minimum at said internal location and increases therefrom in a stepwise manner toward said surface of said thin film.

3. The hard carbon thin film arrangement of claim 1, wherein said ratio of $sp^2$ to $sp^3$ carbon-carbon bonding is varied in the range of –0 to 3.

4. The hard carbon thin film arrangement of claim 1, wherein said hard carbon thin film is a crystalline diamond carbon thin film, an amorphous diamond-like carbon thin film, or a diamond-like carbon thin film having a partial crystalline structure.

5. The hard carbon thin film arrangement of claim 1, further comprising a substrate and an interlayer between said thin film and said substrate, wherein said interface of said thin film is in contact on said interlayer.

6. The hard carbon thin film arrangement of claim 5, wherein said interlayer comprises at least one material selected from the group consisting of Si, Ti, Zr, W, Mo, Ru, Ge, and oxides, nitrides, and carbides thereof.

7. A method for forming the hard carbon thin film arrangement of claim 1, using a plasma CVD technique, comprising imparting and varying an acceleration energy to film-forming ion species in a plasma so as to change kinetic energies thereof during a film-forming time while depositing said ion species, thereby forming said graded carbon composition of said thin film.

8. A method for forming the hard carbon thin film arrangement of claim 1 using a plasma CVD technique, comprising admitting and varying an amount of a hydrogen gas in a reaction system during a film-forming time while depositing said thin film, thereby forming said graded carbon composition of said thin film.

9. A method for forming the hard carbon thin film arrangement of claim 1 using a plasma CVD technique, comprising varying a substrate temperature during a film-forming time while depositing said thin film, thereby forming said graded carbon composition of said thin film.

10. A method for forming the hard carbon thin film arrangement of claim 1 using a plasma CVD technique, comprising supplying varying film-forming ion species during a film-forming time while depositing said ion species, thereby forming said graded carbon composition of said thin film.

11. A method for forming the hard carbon thin film arrangement of claim 1 using a plasma CVD technique, comprising carrying out a combination of a first film-forming process through thermal decomposition of a raw material gas and a second film-forming process through plasma-assisted decomposition of said raw material gas, in such a manner so as to form said graded carbon composition.

12. A hard carbon thin film having a surface exhibiting a surface roughness $h_{rms}$ of not more than one fifth of a thickness of said thin film immediately after formation thereof.

13. The hard carbon thin film of claim 12, wherein said surface roughness is not more than one tenth of said thickness of said thin film.

* * * * *

UNITED STATES PATENT AND TRADEMARK OFFICE
CERTIFICATE OF CORRECTION

PATENT NO. : 6,066,399

DATED : May 23, 2000

INVENTOR(S) : Hirano et al.

It is certified that error appears in the above-identified patent and that said Letters Patent is hereby corrected as shown below:

Col. 7, line 20, after "roughness", delete "has";

Col. 20, line 23, before "an" (first occurrence), replace "MA/cm$^2$", by --mA/cm$^2$--;

Col. 23, line 12, after "claim", replace "11" by --1--.

Signed and Sealed this

Twenty-seventh Day of March, 2001

Attest:

NICHOLAS P. GODICI

*Attesting Officer*    Acting Director of the United States Patent and Trademark Office